(12) United States Patent
O'Donnell et al.

(10) Patent No.: US 6,988,326 B2
(45) Date of Patent: Jan. 24, 2006

(54) PHOBIC BARRIER MENISCUS SEPARATION AND CONTAINMENT

(75) Inventors: Robert J. O'Donnell, Fremont, CA (US); Thomas W. Anderson, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/957,384

(22) Filed: Sep. 30, 2004

(65) Prior Publication Data

US 2005/0217135 A1     Oct. 6, 2005

Related U.S. Application Data

(63) Continuation-in-part of application No. 10/883,301, filed on Jun. 30, 2004, which is a continuation-in-part of application No. 10/404,692, filed on Mar. 31, 2003, which is a continuation-in-part of application No. 10/330,843, filed on Dec. 24, 2002, which is a continuation-in-part of application No. 10/261,839, filed on Sep. 30, 2002.

(51) Int. Cl.
    F26B 21/06        (2006.01)

(52) U.S. Cl. ............................................ 34/381; 34/79
(58) Field of Classification Search .................. 34/310, 34/351, 381, 442, 76, 78, 79; 118/400, 317
See application file for complete search history.

(56) References Cited

U.S. PATENT DOCUMENTS

| | | | | |
|---|---|---|---|---|
| 3,953,265 A | * | 4/1976 | Hood | 438/8 |
| 5,343,234 A | * | 8/1994 | Kuehnle | 347/128 |
| 5,807,522 A | * | 9/1998 | Brown et al. | 422/50 |
| 6,364,449 B1 | * | 4/2002 | Takahashi et al. | 347/30 |
| 6,610,189 B2 | * | 8/2003 | Wang et al. | 205/88 |

* cited by examiner

*Primary Examiner*—Stephen Gravini
(74) *Attorney, Agent, or Firm*—Martine Penilla & Gencarella, LLP

(57) ABSTRACT

In one of the many embodiments, a method for processing a substrate is provided which includes generating a first fluid meniscus and a second fluid meniscus on a surface of the substrate where the first fluid meniscus being substantially adjacent to the second fluid meniscus. The meniscus also includes substantially separating the first fluid meniscus and the second fluid meniscus with a barrier.

28 Claims, 22 Drawing Sheets

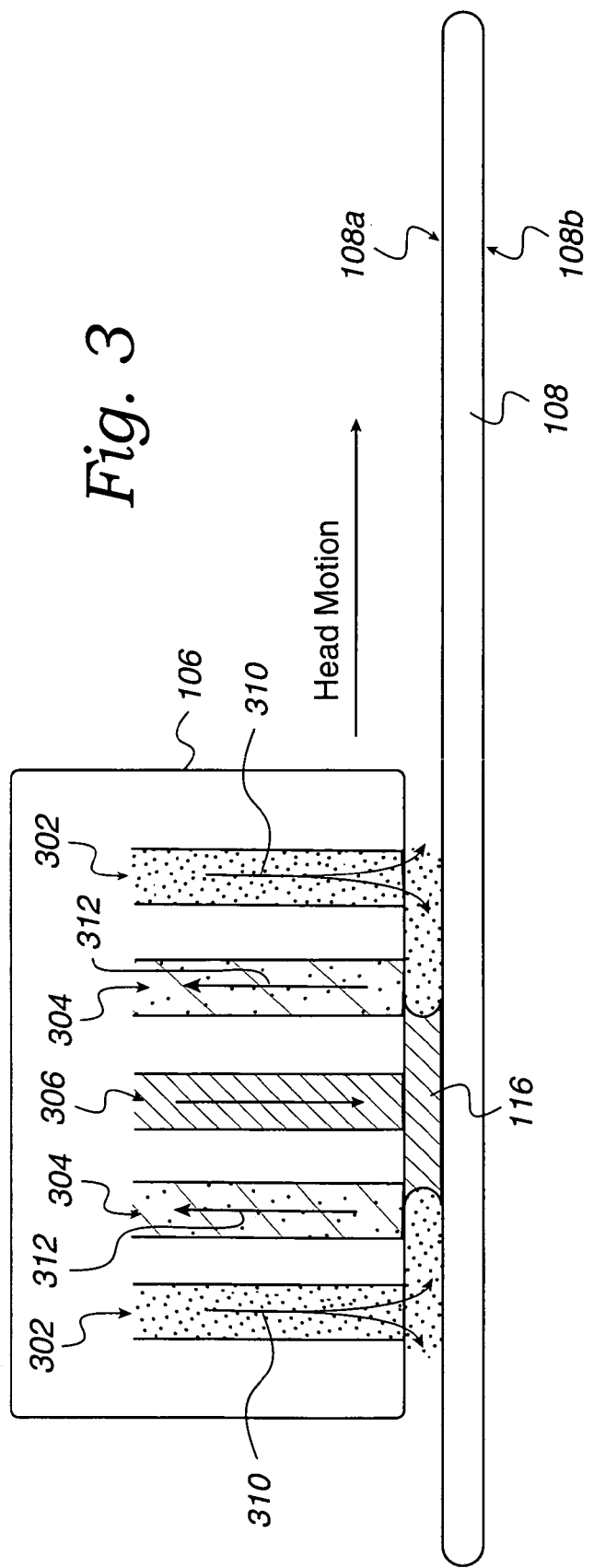

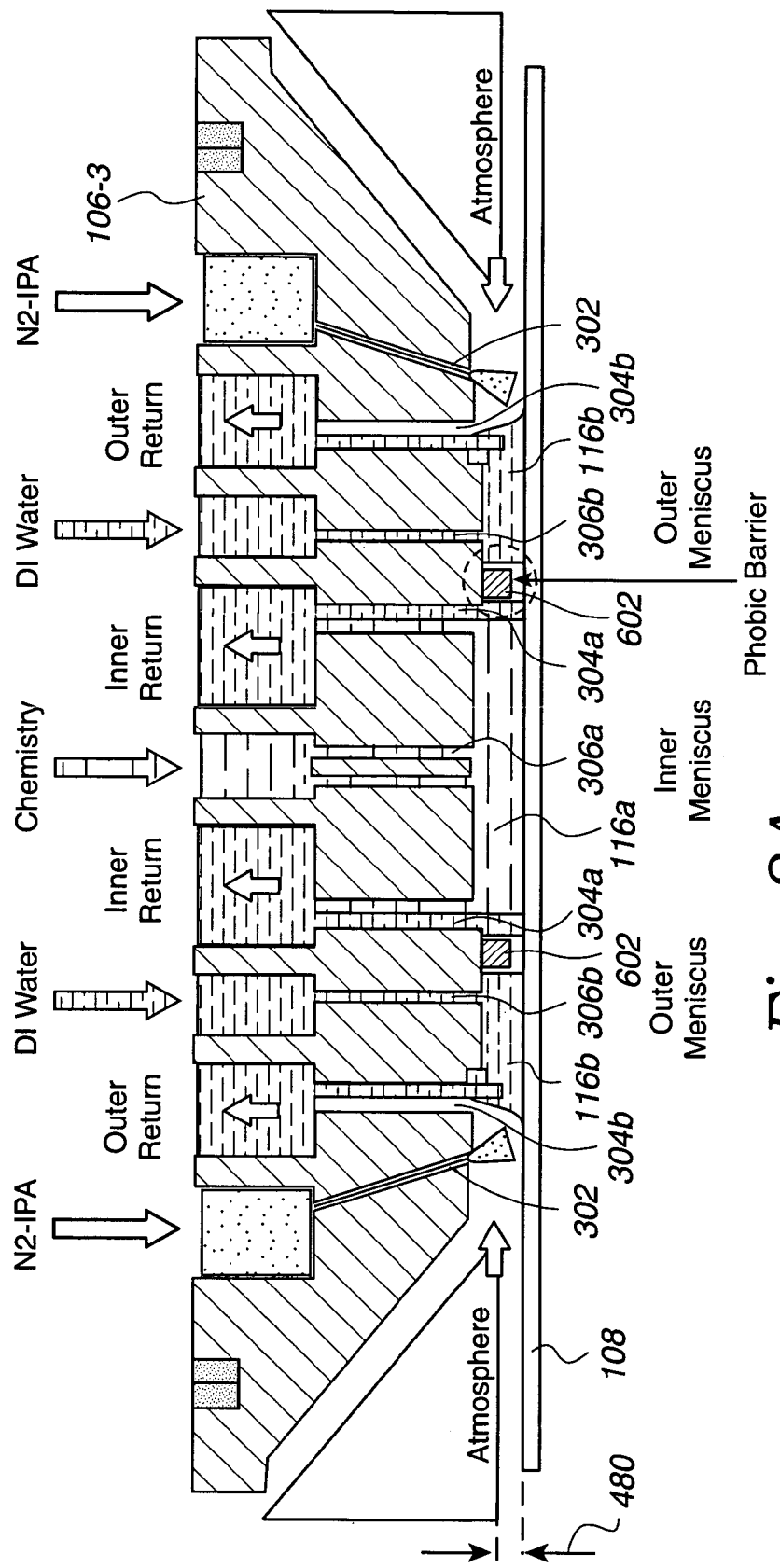

PHOBIC BARRIER MENISCUS SEPARATION AND CONTAINMENT

CROSS REFERENCE To RELATED APPLICATION

This is a continuation-in-part of a co-pending U.S. patent application Ser. No. 10/883,301, filed on Jun. 30, 2004 from which priority under 35 U.S.C. § 120 is claimed, entitled "Concentric Proximity Processing Head" which is a continuation-in-part of U.S. patent application Ser. No. 10/404,692, filed on Mar. 31, 2003, from which priority under 35 U.S.C. § 120 is claimed, entitled "Methods and Systems for Processing a Substrate Using a Dynamic Liquid Meniscus" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." The aforementioned patent applications are hereby incorporated by reference in their entirety.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer processing costs.

2. Description of the Related Art

In the semiconductor chip fabrication process, it is well-known that there is a need to process a wafer using operations such as cleaning and drying. In each of these types of operations, there is a need to effectively apply and remove fluids for the wafer operation process.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form water spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

FIG. 1A illustrates movement of fluids on a wafer 10 during an SRD process. In this drying process, a wet wafer is rotated at a high rate by rotation 14. In SRD, by use of centrifugal force, the fluid used to rinse the wafer is pulled from the center of the wafer to the outside of the wafer and finally off of the wafer as shown by fluid directional arrows 16. As the fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water-based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing the formation of cleaning fluid droplets on the wafer surface especially when used on hydrophobic wafer surfaces. Also, certain portions of the wafer may have different hydrophobic properties.

FIG. 1B illustrates an exemplary wafer drying process 18. In this example a portion 20 of the wafer 10 has a hydrophilic area and a portion 22 has a hydrophobic area. The portion 20 attracts water so a fluid 26 pools in that area. The portion 22 is hydrophobic so that area repels water and therefore there can be a thinner film of water on that portion of the wafer 10. Therefore, the hydrophobic portions of the wafer 10 often dry more quickly than the hydrophilic portions. This may lead to inconsistent wafer drying that can increase contamination levels and therefore decrease wafer production yields.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a substrate processing apparatus that is capable of processing wafer surfaces with multiple menisci while significantly reducing wafer contamination. It should be appreciated that the present invention can be implemented in numerous ways, including as a process, an apparatus, a system, a device or a method. Several inventive embodiments of the present invention are described below.

In one embodiment, a method for processing a substrate is provided which includes generating a first fluid meniscus and a second fluid meniscus on a surface of the substrate where the first fluid meniscus being substantially adjacent to the second fluid meniscus. The meniscus also includes substantially separating the first fluid meniscus and the second fluid meniscus with a barrier.

In yet another embodiment, an apparatus for processing a substrate is disclosed which includes a proximity head. The proximity head includes a first set of conduits defined within the proximity head where the first set of conduits configured to generate a first fluid meniscus. The proximity head also includes a second set of conduits defined within the proximity head where the second set of conduits configured to generate a second fluid meniscus. The proximity head further includes a barrier defined between the first set of conduits and the second set of conduits where the barrier substantially separates the first fluid meniscus and the second fluid meniscus.

In another embodiment, an apparatus for processing a substrate is provided which includes a proximity head capable of generating a first fluid meniscus and capable of generating a second fluid meniscus. The proximity head includes at least one first inlet defined in a processing surface of the proximity head configured to apply a first fluid to the surface of the wafer and at least one first outlet defined in the processing surface of the proximity head configured to remove the first fluid and at least a portion of a second fluid from the surface of the wafer. The proximity head further includes at least one second inlet defined in the processing surface of the proximity head configured to apply the second fluid to the surface of the wafer and at least one second outlet defined in the processing surface of the proximity head configured to remove at least a portion of the second fluid from the surface of the wafer. The proximity head also includes a barrier between the at least one first outlet and the at least one second outlet where the barrier substantially separates the first fluid meniscus and the second fluid meniscus.

The advantages of the present invention are numerous. Most notably, the apparatuses and methods described herein utilize barriers to separate multiple menisci to efficiently process (e.g., clean, dry, etc.) substrates by operations which involve optimal management of fluid application and removal from the substrate while reducing unwanted fluids and contaminants remaining on a wafer surface. Consequently, wafer processing and production may be increased and higher wafer yields may be achieved due to efficient wafer processing.

The present invention enables optimal wafer processing through the generation and use of multiple fluid menisci with one meniscus being separated from another fluid meniscus by a barrier. In one embodiment, a first set of fluid inlets and outlets may be utilized which can generate a first fluid meniscus that is separate from a second fluid meniscus that is generated by a second set of fluid inlets and outlets. In additional embodiments, any suitable number and/or configuration of menisci may be separated by barrier(s) to optimize menisci management.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 3 illustrates a proximity head performing a wafer processing operation in accordance with one embodiment of the present invention.

FIG. 8A illustrates a cross-sectional view of the multi-menisci proximity head which is utilized to process a phobic barrier in accordance with one embodiment of the present invention.

DETAILED DESCRIPTION

Figure 1A:
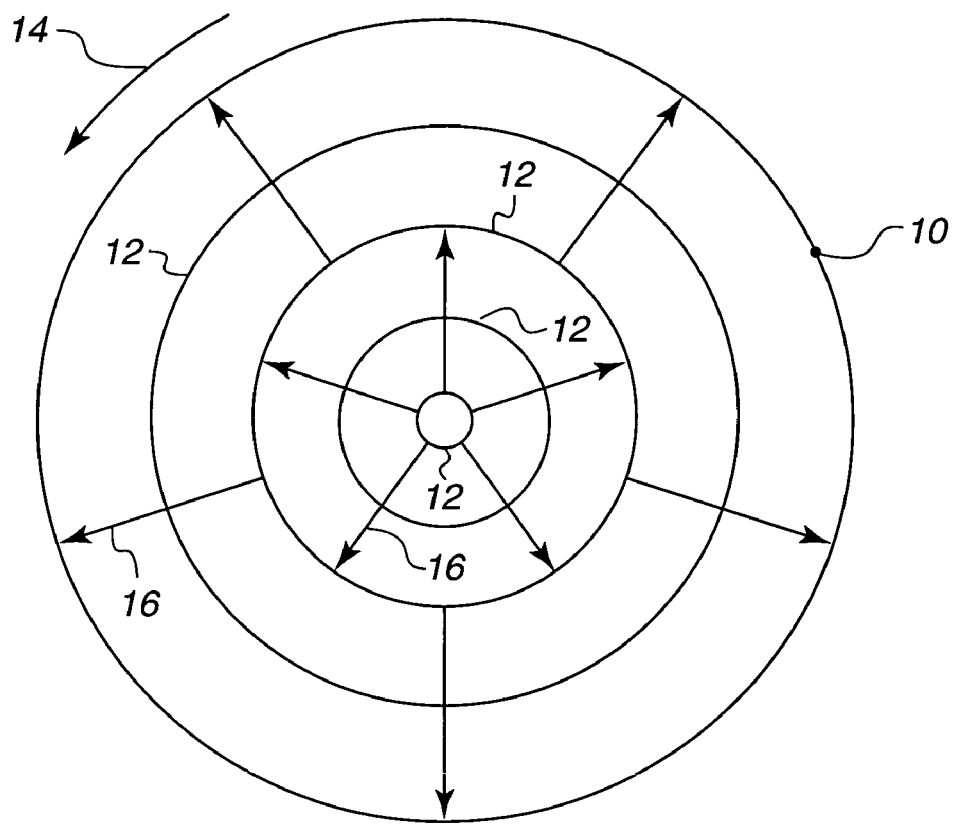
FIG. 1A illustrates movement of cleaning fluids on a wafer during an SRD drying process.
Figure 1B:
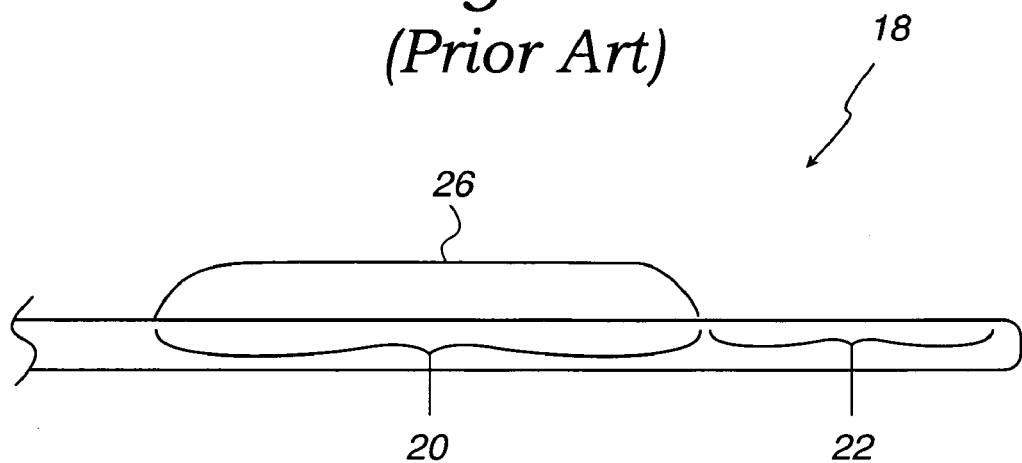
FIG. 1B illustrates an exemplary wafer drying process.

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using multi-menisci proximity heads to generate multiple shape, size, and location of fluid menisci separated by a barrier on the proximity head. In one embodiment, the multiple menisci are separated by the barrier and the fluids of that make up the each of the respective menisci do not intermingle due to the separation of the menisci. This technology may be utilized to perform any suitable type of combination of types of wafer operation(s) such as, for example drying, etching, plating, etc.

It should be appreciated that the systems and proximity heads as described herein are exemplary in nature, and that any other suitable types of configurations that would enable the generation and movement of two or more menisci separated by the barrier described herein may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In further embodiments, the proximity head may be held stationary and the wafer may be moved to be processed by the fluid meniscus. As with the proximity head, the wafer may move in any suitable motion as long as the desired wafer processing operation is accomplished.

In addition, the proximity head and the wafer processing system as described herein may be utilized to process any shape and size of substrates such as for example, 200 mm wafers, 300 mm wafers, flat panels, etc. Moreover, the size of the proximity head and in turn the sizes of the menisci may vary. In one embodiment, the size of the proximity head and the sizes of the menisci may be larger than a wafer being processed, and in another embodiment, the proximity head and the sizes of the menisci may be smaller than the wafer being processed. Furthermore, the menisci as discussed herein may be utilized with other forms of wafer processing technologies such as, for example, brushing, lithography, megasonics, etc.

A fluid meniscus can be supported and moved (e.g., onto, off of and across a wafer) with a proximity head. Various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method." Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." The aforementioned patent applications are hereby incorporated by reference in their entirety.

It should be appreciated that the system described herein is just exemplary in nature, and the proximity heads described herein may be used in any suitable system such as, for example, those described in the United States patent applications referenced above. It should also be appreciated that FIGS. 2 through 4B describe formation of a single meniscus and therefore process variables (e.g. flow rates, dimensions, etc.) described therein may be different than the process variables described for multi-menisci proximity heads as described in FIGS. 5A through 12.

FIGS. 2 through 4A show exemplary proximity heads that can produce a single meniscus and are discussed to illustrate how a meniscus may be generated. FIGS. 5A through 7 illustrate examples of proximity heads that can generate multiple menisci without barrier separation. FIGS. 8A through 12 show proximity heads which include at least one barrier between a first set of conduits configured to generate a first fluid meniscus and a second set of conduits configured to generate a second fluid meniscus. The barrier between the first set of conduits and the second set of conduits enable the separation of fluid menisci formed when the proximity head is in operation.

Figure 2:
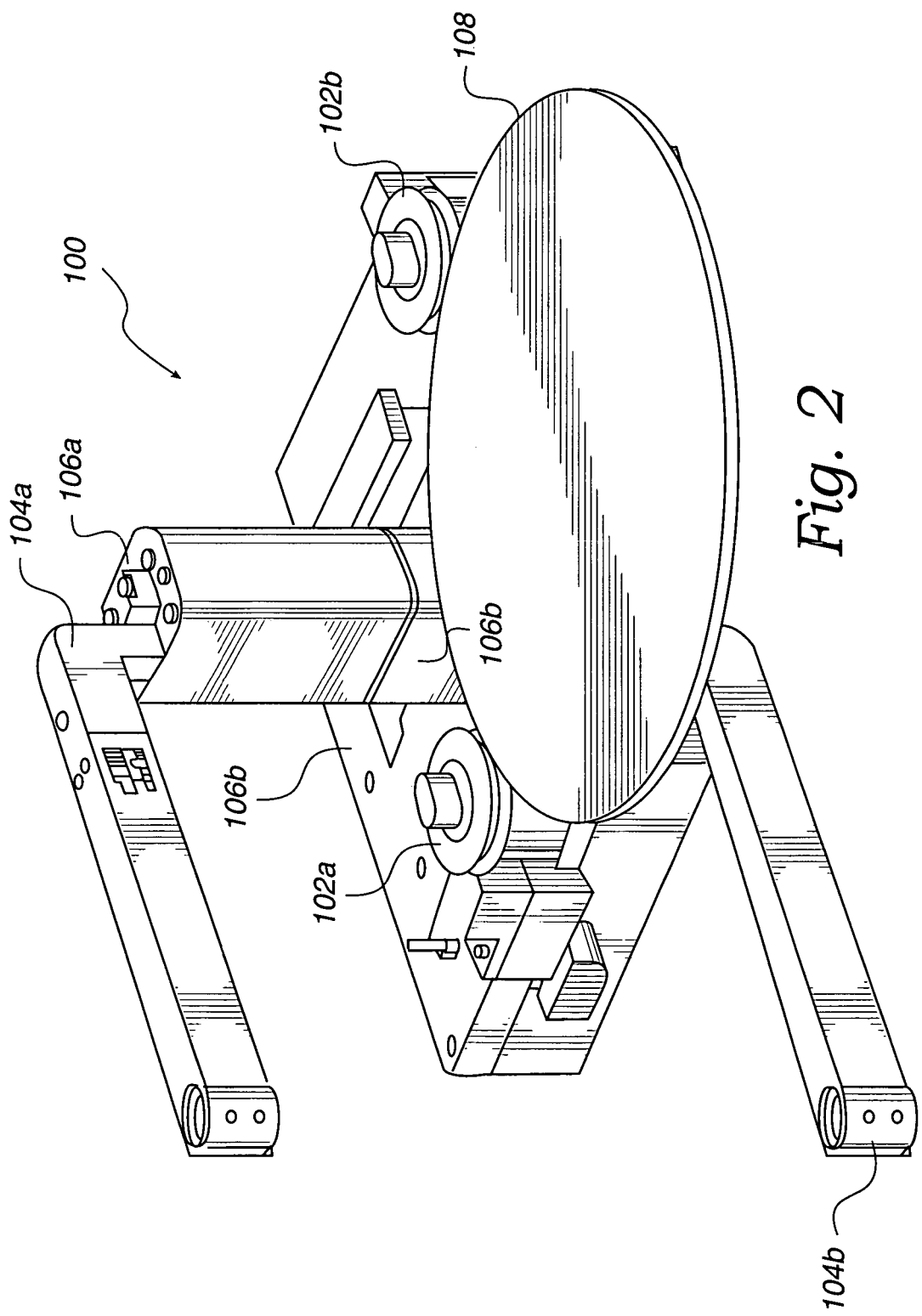
FIG. 2 shows a wafer processing system in accordance with one embodiment of the present invention.

FIG. 2 shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. In one embodiment, the proximity heads 106a and/or 106b may be multi-menisci proximity heads as described in further detail below. As described herein the term "multi-menisci proximity head" is a proximity head capable of generating one or more fluid menisci. In a one embodiment, a first fluid meniscus is substantially surrounded by a second fluid meniscus. In a preferable embodiment, the first fluid meniscus and the second fluid meniscus are concentric with the second fluid meniscus surrounding the first fluid meniscus. The proximity head may be any suitable apparatus that may generate a fluid meniscus as described herein and described in the patent application incorporated by reference above. The upper arm 104a and the lower arm 104b can be part of an assembly which enables substantially linear movement (or in another embodiment a slight arc-like movement) of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where the menisci are generated before processing and the menisci that has already been generated between the proximity heads 106a and 106 may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control multiple meniscus that, in one embodiment, are concentric with each other. It should also be understood that close proximity may be any suitable distance from the wafer as long as a menisci may be maintained. In one embodiment, the proximity heads 106a and 106b (as well as any other proximity head described herein) may each be located between about 0.1 mm to about 10 mm from the wafer to generate the fluid menisci on the wafer surface. In a preferable embodiment, the proximity heads 106a and 106b (as well as any other proximity head described herein) may each be located bout 0.5 mm to about 2.0 mm from the wafer to generate the fluid menisci on the wafer surface, and in more preferable embodiment, the proximity heads 106a and 106b (as well as any other proximity head described herein) may be located about 1.5 mm from the wafer to generate the fluid menisci on the wafer surface.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate the fluid menisci between the proximity head and the wafer. The fluid menisci may be moved across the wafer to process the wafer by applying fluid to the wafer surface and removing fluids from the surface. In such a way, depending on the fluids applied to the wafer, cleaning, drying, etching, and/or plating may be accomplished. In addition, the first fluid meniscus may conduct one type of operation and the second fluid meniscus that at least partially surrounds the first fluid meniscus may conduct the same operation or a different wafer processing operation as the first fluid meniscus. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration menisci. The proximity heads can also be configured to process the bevel edge of the wafer in addition to processing the top and/or bottom of the wafer. This can be accomplished by moving the menisci off (or onto) the edge the wafer which processes the bevel edge. It should also be understood that the proximity heads 106a and 106b may be the same type of apparatus or different types of proximity heads.

The wafer 108 may be held and rotated by the rollers 102a and 102b in any suitable orientation as long as the orientation enables a desired proximity head to be in close proximity to a portion of the wafer 108 that is to be processed. In one embodiment, the rollers 102a and 102b can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a and 102b serves to move a wafer area that has not been processed into close proximity to the proximity heads 106a and 106b. However, the rotation itself does not dry the wafer or move fluid on the wafer surfaces towards the edge of the wafer. Therefore, in an exemplary wafer processing operation, the unprocessed areas of the wafer would be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary drying embodiment, the at least one of first inlet may be configured to input deionized water (DIW) (also known as a DIW inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head by applying vacuum (also known as vacuum outlet). It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water. In addition, in other embodiments, any suitable type of non-miscible vapors may be utilized such as, for example, oil, hexane, oil-vapor, etc.

In an exemplary cleaning embodiment, a cleaning solution may be substituted for the DIW. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. In addition, other types of solutions may be inputted into the first inlet and the second inlet depending on the processing operation desired.

It should be appreciated that the inlets and outlets located on a face of the proximity head may be in any suitable configuration as long as stable menisci as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. Such a configuration can generate an outside meniscus that at least partially surrounds the inside meniscus. In addition, the inside meniscus may be generated through a configuration with a processing fluid-vacuum orientation. Therefore, one exemplary embodiment where a second fluid meniscus at least partially surrounds a first fluid meniscus may be generated by an IPA-vacuum-second processing fluid-vacuum-first processing fluid-vacuum-second processing fluid-vacuum-IPA orientation as described in further detail below. It should be appreciated that other types of orientation combinations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In one embodiment, the IPA-vacuum-processing fluid orientation may be utilized to intelligently and powerfully generate, control, and move the menisci located between a proximity head and a wafer to process wafers. The processing fluid inlets, the $N_2$/IPA vapor inlets, and the vacuum outlets may be arranged in any suitable manner if the above orientation is maintained. For example, in addition to the $N_2$/IPA vapor inlet, the vacuum outlet, and the processing fluid inlet, in an additional embodiment, there may be additional sets of IPA vapor outlets, processing fluid inlets and/or vacuum outlets depending on the configuration of the proximity head desired. It should be appreciated that the exact configuration of the inlet and outlet orientation may be varied depending on the application. For example, the distance between the IPA input, vacuum, and processing fluid inlet locations may be varied so the distances are consistent or so the distances are inconsistent. In addition, the distances between the IPA input, vacuum, and processing fluid outlet may differ in magnitude depending on the size, shape, and configuration of the proximity head 106a and the desired size of a process menisci (i.e., menisci shape and size). In addition, exemplary IPA-vacuum-processing fluid orientation may be found as described in the United States patent applications referenced above.

In one embodiment, the proximity heads 106a and 106b may be positioned in close proximity to a top surface and a bottom surface respectively of the wafer 108 and may utilize the IPA and DIW inlets and a vacuum outlets as described herein to generate wafer processing menisci in contact with the wafer 108 which are capable of processing the top surface and the bottom surface of the wafer 108. The wafer processing menisci may be generated in a manner consistent with the descriptions in reference to Applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. These fluids may also be known as surface tension reducing fluids. The portion of the processing fluid that is in the region between the proximity head and the wafer is the menisci. It should be appreciated that as used herein, the term "output" can refer to the removal of fluid from a region between the wafer 108 and a particular proximity head, and the term "input" can be the introduction of fluid to the region between the wafer 108 and the particular proximity head. In another embodiment, the proximity heads 106a and 106b may be scanned over the wafer 108 while being moved at the end of an arm that is being moved in a slight arc.

FIG. 3 illustrates a proximity head 106 performing a wafer processing operation in accordance with one embodiment of the present invention. FIGS. 3 through 4B show a method of generating a basic fluid meniscus while FIGS. 5A through 12 discuss apparatuses and methods for generating a more complex menisci configuration. The proximity head 106, in one embodiment, moves while in close proximity to a top surface 108a of the wafer 108 to conduct a wafer processing operation. It should be appreciated that the proximity head 106 may also be utilized to process (e.g., clean, dry, plate, etch, etc.) a bottom surface 108b of the wafer 108. In one embodiment, the wafer 108 is rotating so the proximity head 106 may be moved in a linear fashion along the head motion while the top surface 108a is being processed. By applying the IPA 310 through the inlet 302, the vacuum 312 through outlet 304, and the processing fluid 314 through the inlet 306, the meniscus 116 may be generated. It should be appreciated that the orientation of the inlets/outlets as shown in FIG. 3 is only exemplary in nature, and that any suitable inlets/outlets orientation that may produce a stable fluid meniscus may be utilized such as those configurations as described in the United States patent applications incorporated by reference previously.

Figure 4A:
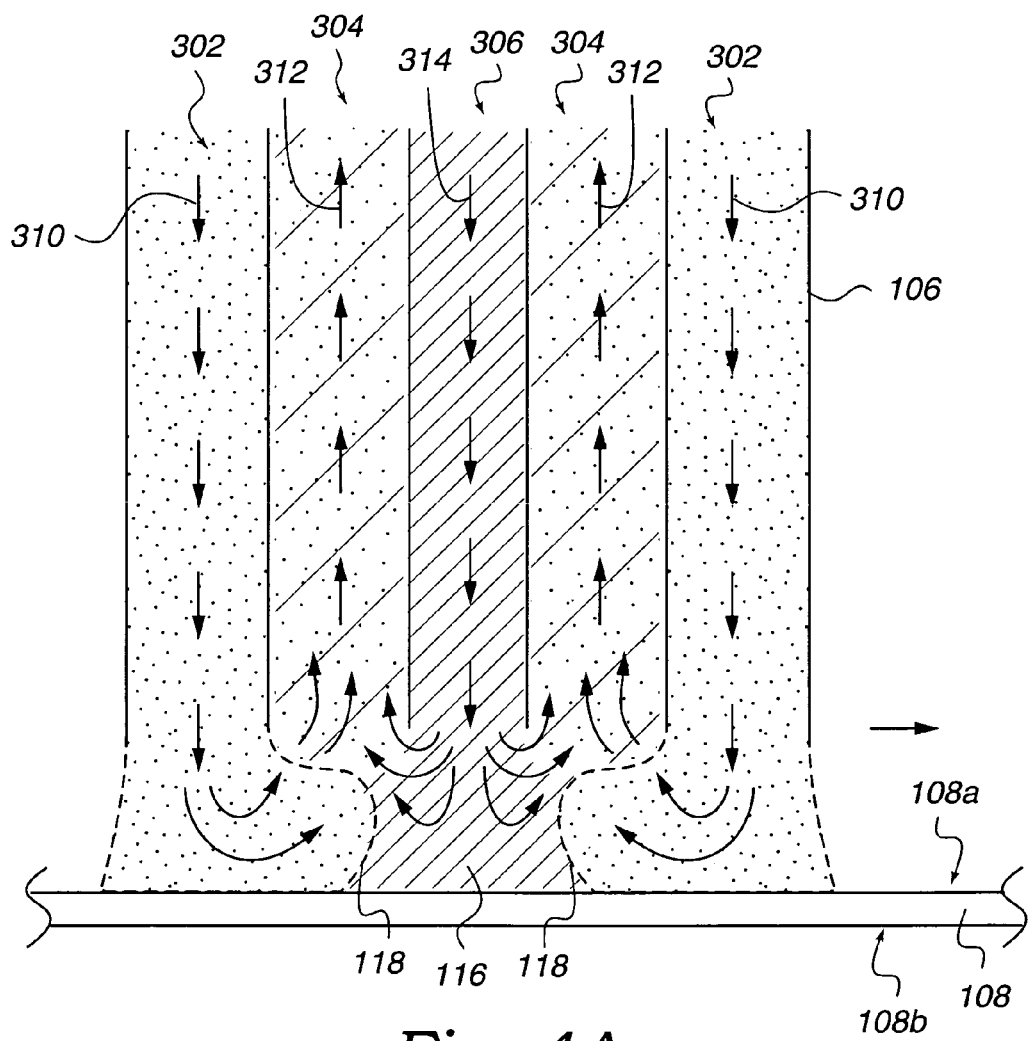
FIG. 4A illustrates a wafer processing operation that may be conducted by a proximity head in accordance with one embodiment of the present invention.
Figure 4B:
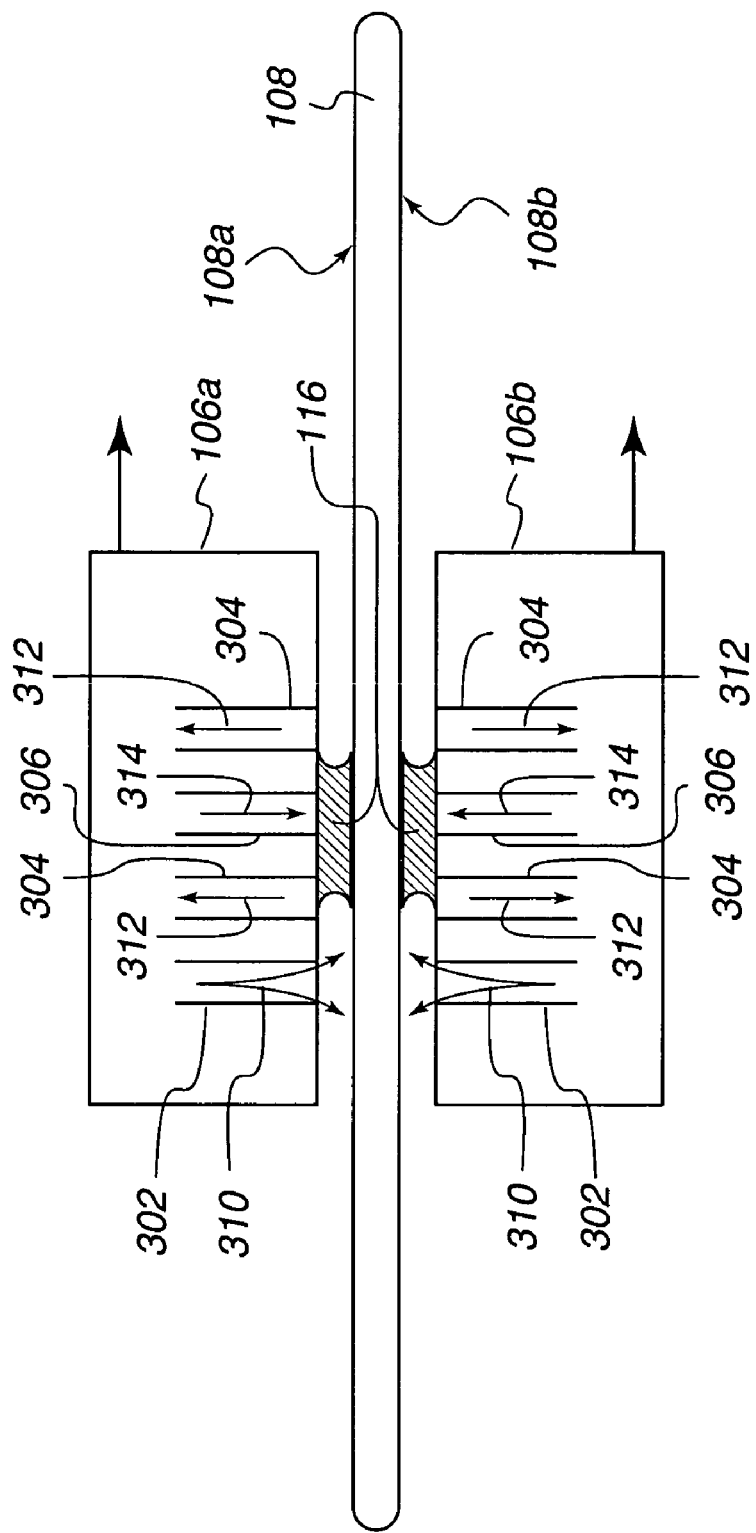
FIG. 4B illustrates a side view of exemplary proximity heads for use in a dual wafer surface processing system in accordance with one embodiment of the present invention.

FIG. 4A illustrates a wafer processing operation that may be conducted by a proximity head 106a in accordance with one embodiment of the present invention. Although FIG. 4A shows a top surface 108a being processed, it should be appreciated that the wafer processing may be accomplished in substantially the same way for the bottom surface 108b of the wafer 108. In one embodiment, the inlet 302 may be utilized to apply isopropyl alcohol (IPA) vapor toward a top surface 108a of the wafer 108, and the inlet 306 may be utilized to apply a processing fluid toward the top surface 108a of the wafer 108. In addition, the outlet 304 may be utilized to apply vacuum to a region in close proximity to the wafer surface to remove fluid or vapor that may located on or near the top surface 108a. As described above, it should be appreciated that any suitable combination of inlets and outlets may be utilized as long as the meniscus 116 may be formed. The IPA may be in any suitable form such as, for example, IPA vapor where IPA in vapor form is inputted through use of a $N_2$ gas. Moreover, any suitable fluid used for processing the wafer (e.g., cleaning fluid, drying fluid, etching fluid, plating fluid, etc.) may be utilized that may enable or enhance the wafer processing. In one embodiment, an IPA inflow 310 is provided through the inlet 302, a vacuum 312 may be applied through the outlet 304 and processing fluid inflow 314 may be provided through the inlet 306. Consequently, if a fluid film resides on the wafer 108, a first fluid pressure may be applied to the wafer surface by the IPA inflow 310, a second fluid pressure may be applied to the wafer surface by the processing fluid inflow 314, and a third fluid pressure may be applied by the vacuum 312 to remove the processing fluid, IPA and the fluid film on the wafer surface.

Therefore, in one embodiment of a wafer processing, as the processing fluid inflow 314 and the IPA inflow 310 is applied toward a wafer surface, fluid (if any) on the wafer surface is intermixed with the processing inflow 314. At this time, the processing fluid inflow 314 that is applied toward the wafer surface encounters the IPA inflow 310. The IPA forms an interface 118 (also known as an IPA/processing fluid interface 118) with the processing fluid inflow 314 and along with the vacuum 312 assists in the removal of the processing fluid inflow 314 along with any other fluid from the surface of the wafer 108. In one embodiment, the IPA/processing fluid interface 118 reduces the surface of tension of the processing fluid. In operation, the processing fluid is applied toward the wafer surface and almost immediately removed along with fluid on the wafer surface by the vacuum applied by the outlet 304. The processing that is applied toward the wafer surface and for a moment resides in the region between a proximity head and the wafer surface along with any fluid on the wafer surface forms a meniscus 116 where the borders of the meniscus 116 are the IPA/processing fluid interfaces 118. Therefore, the meniscus 116 is a constant flow of fluid being applied toward the surface and being removed at substantially the same time with any fluid on the wafer surface. The nearly immediate removal of the processing fluid from the wafer surface prevents the formation of fluid droplets on the region of the wafer surface being dried thereby reducing the possibility of contamination on the wafer 108 after the processing fluid has accomplished its purpose depending on the operation (e.g., etching, cleaning, drying, plating, etc.). The pressure (which is caused by the flow rate of the IPA) of the downward injection of IPA also helps contain the meniscus 116.

The flow rate of the N2 carrier gas containing the IPA may assist in causing a shift or a push of processing fluid flow out of the region between the proximity head and the wafer surface and into the outlets 304 (vacuum outlets) through which the fluids may be outputted from the proximity head. It is noted that the push of processing fluid flow is not a process requirement but can be used to optimize meniscus boundary control. Therefore, as the IPA and the processing fluid are pulled into the outlets 304, the boundary making up the IPA/processing fluid interface 118 is not a continuous boundary because gas (e.g., air) is being pulled into the outlets 304 along with the fluids. In one embodiment, as the vacuum from the outlets 304 pulls the processing fluid, IPA, and the fluid on the wafer surface, the flow into the outlets 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/processing fluid interface 118. It should also be understood that the any suitable number of inlets 302, outlets 304 and inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the $N_2$/IPA, processing fluid, and vacuum as long as the meniscus 116 can be maintained. In one embodiment, the flow rate of the processing fluid through a set of the inlets 306 is between about 25 ml per minute to about 3,000 ml per minute. In a preferable embodiment, the flow rate of the processing fluid through the set of the inlets 306 is about 800 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more inlets 302 and 306 and outlets 304.

In one embodiment, the flow rate of the $N_2$/IPA vapor through a set of the inlets 302 is between about 1 liters per minute (SLPM) to about 100 SLPM. In a preferable embodiment, the IPA flow rate is between about 6 and 20 SLPM.

In one embodiment, the flow rate for the vacuum through a set of the outlets 304 is between about 10 standard cubic feet per hour (SCFH) to about 1250 SCFH. In a preferable embodiment, the flow rate for a vacuum though the set of the outlets 304 is about 350 SCFH. In an exemplary embodiment, a flow meter may be utilized to measure the flow rate of the $N_2$/IPA, processing fluid, and the vacuum.

It should be appreciated that any suitable type of wafer processing operation may be conducted using the meniscus depending on the processing fluid utilized. For example, a cleaning fluid such as, for example, SC-1, SC-2, etc., may be used for the processing fluid to generate wafer cleaning operation. In a similar fashion, different fluids may be utilized and similar inlet and outlet configurations may be utilized so the wafer processing meniscus may also etch and/or plate the wafer. In one embodiment, etching fluids such as, for example, HF, EKC proprietary solution, KOH etc., may be utilized to etch the wafer. In another embodiment, plating fluids such as, for example, Cu Sulfate, Au Chloride, Ag Sulfate, etc. in conjunction with electrical input may be conducted.

FIG. 4B illustrates a side view of exemplary proximity heads 106 and 106b for use in a dual wafer surface processing system in accordance with one embodiment of the present invention. In this embodiment, by usage of inlets 302 and 306 to input $N_2$/IPA and processing respectively along with the outlet 304 to provide a vacuum, the meniscus 116 may be generated. In addition, on the side of the inlet 306 opposite that of the inlet 302, there may be a outlet 304 to remove processing fluid and to keep the meniscus 116 intact. As discussed above, in one embodiment, the inlets 302 and 306 may be utilized for IPA inflow 310 and processing fluid inflow 314 respectively while the outlet 304 may be utilized to apply vacuum 312. In addition, in yet more embodiments, the proximity heads 106 and 106b may be of a configuration as shown in the United States patent applications referenced above. Any suitable surface coming into contact with the meniscus 116 such as, for example, wafer surfaces 108a and 108b of the wafer 108' may be processed by the movement of the meniscus 116 into and away from the surface.

FIGS. 5A through 8C show embodiments of the present invention where a first fluid meniscus is at least partially surrounded by at least a second fluid meniscus. It should be appreciated that the first fluid meniscus and/or the second fluid meniscus may be generated to conduct any suitable type of substrate/wafer processing operation such as, for example, lithography, etching, plating, cleaning, and drying. The first fluid meniscus and the second fluid meniscus may be any suitable shape or size depending on the substrate processing operation desired. In certain embodiments described herein, the first fluid meniscus and the second fluid meniscus are concentric where the second fluid meniscus surrounds the first fluid meniscus and the first fluid meniscus and the second fluid meniscus provide a continuous fluid connection. Therefore, after the first fluid meniscus processes the substrate, the portion of the wafer processed by the first fluid meniscus is immediately processed by the second fluid meniscus without a substantial amount of the contact with the atmosphere. It should be appreciated that depending on the operation desired, in one embodiment, the first fluid meniscus may contact the second meniscus and in another embodiment, the first fluid meniscus does not directly contact the second meniscus.

Figure 5A:
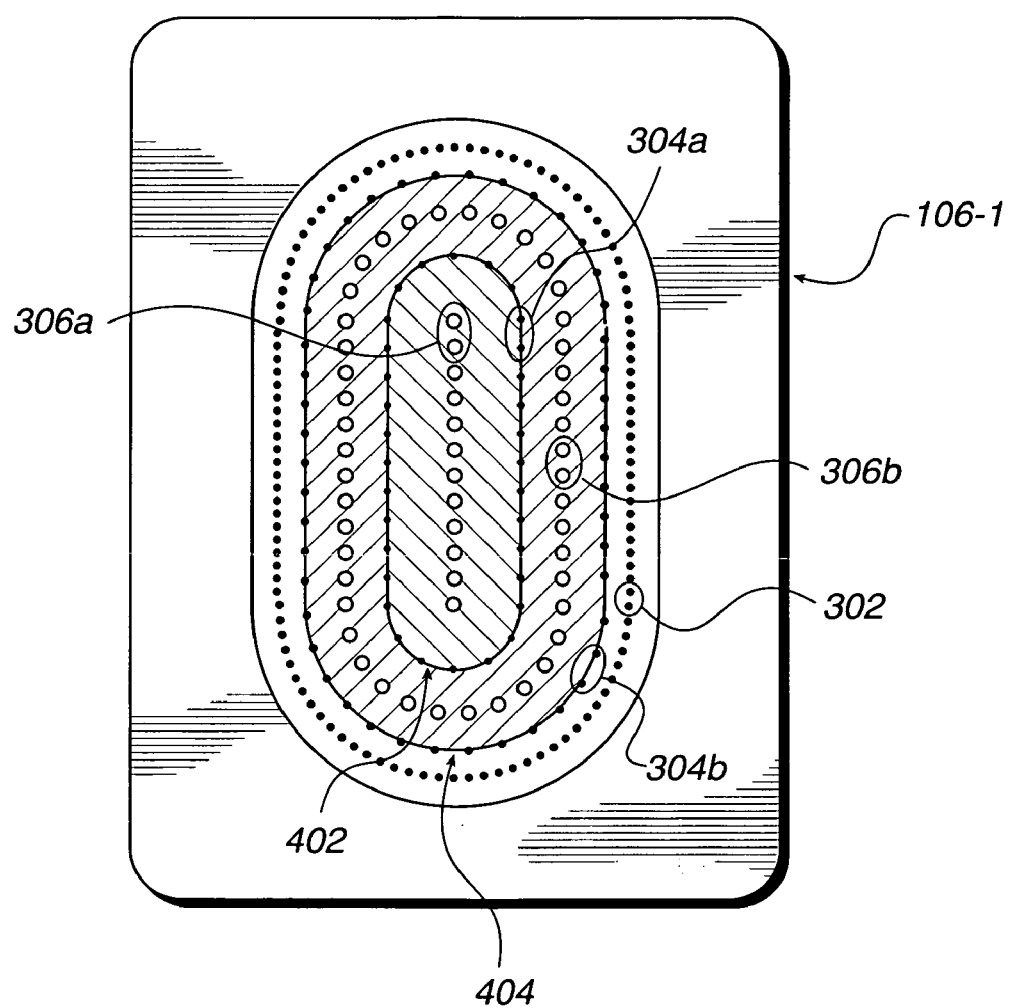
FIG. 5A shows a multi-menisci proximity head in accordance with one embodiment of the present invention.

FIG. 5A shows a multi-menisci proximity head 106-1 in accordance with one embodiment of the present invention. The multi-menisci proximity head 106-1 includes a plurality of source inlets 306a that can apply a first fluid to the wafer surface. The first fluid can then be removed from the wafer surface by application of vacuum through a plurality of source outlets 304a. Therefore, the first fluid meniscus may be generated by the conduits located within a first fluid meniscus region 402 of the processing surface on the multi-menisci proximity head 106-1.

The multi-menisci proximity head 106-1 may also include a plurality of source inlets 306b that can apply a second fluid to the wafer surface. The second fluid can then be removed from the wafer surface by application of vacuum through a plurality of source outlets 304b. In one embodiment, a portion of the second fluid is also removed by the plurality of source outlets 304a in conjunction with the removal of the first fluid. In one embodiment, the plurality of source outlets 304a may be called a one phase fluid removal conduit because the outlets 304a remove liquids applied to the wafer through the source inlets 306a and 306b. In addition, the plurality of source outlets 306b may be called a two phase removal conduit because the outlets 306b removes the second fluid from the source inlets 306b and the atmosphere outside of the fluid meniscus. Therefore, in one embodiment, the outlets 306b removes both liquid and gas while the outlets 306a remove only liquids. As a result, the second fluid meniscus may be created by the conduits located within a second fluid meniscus region 404 of the processing surface on the multi-meniscus proximity head 106-1.

Optionally, the multi-menisci proximity head 106-1 may include a plurality of source inlets 302 which can apply a third fluid to the wafer surface. In one embodiment, the third fluid may be a surface tension reducing fluid that can reduce the surface tension of a liquid/atmosphere border of the second meniscus formed by that application of the second fluid to the wafer surface.

In addition, the processing surface (e.g., the surface area of the multi-menisci proximity head where the conduits exist) of the multi-menisci proximity head 106-1 (or any other proximity head discussed herein) may be of any suitable topography such as, for example, flat, raised, lowered. In one embodiment, the processing surface of the multi-menisci 106-1 may have a substantially flat surface.

Figure 5B:
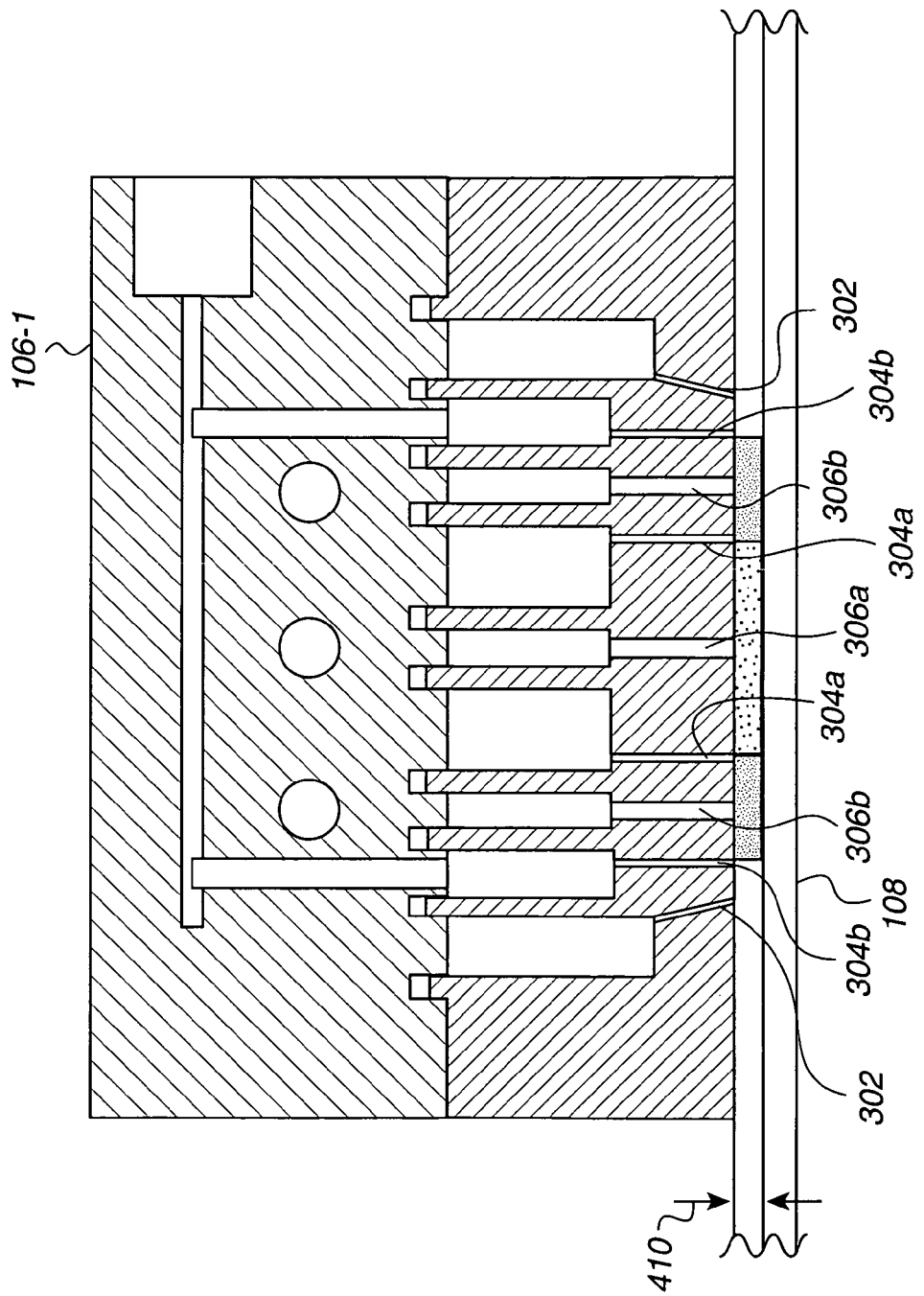
FIG. 5B shows a cross section view of the multi-menisci proximity head in accordance with one embodiment of the present invention.

FIG. 5B shows a cross section view of the multi-menisci proximity head 106-1 in accordance with one embodiment of the present invention. The multi-menisci proximity head 106-1 can apply the first fluid through the plurality of source inlets 306a and remove the first fluid through the plurality of source outlets 304a. The first fluid meniscus 116a is located underneath a region substantially surrounded by the plurality of source outlets 304a. The multi-menisci proximity head 106-1 can also apply the second fluid through the plurality of source inlets 306b and remove the second fluid through the plurality of source outlets 304a on one side of the second fluid meniscus and 304b on the other side. In one embodiment, the plurality of source inlets 302 may apply the third fluid to decrease the surface tension of the fluid making up the second fluid meniscus 116b. The plurality of source inlets 302 may be optionally angled to better confine the second fluid meniscus 1116b.

Figure 6A:
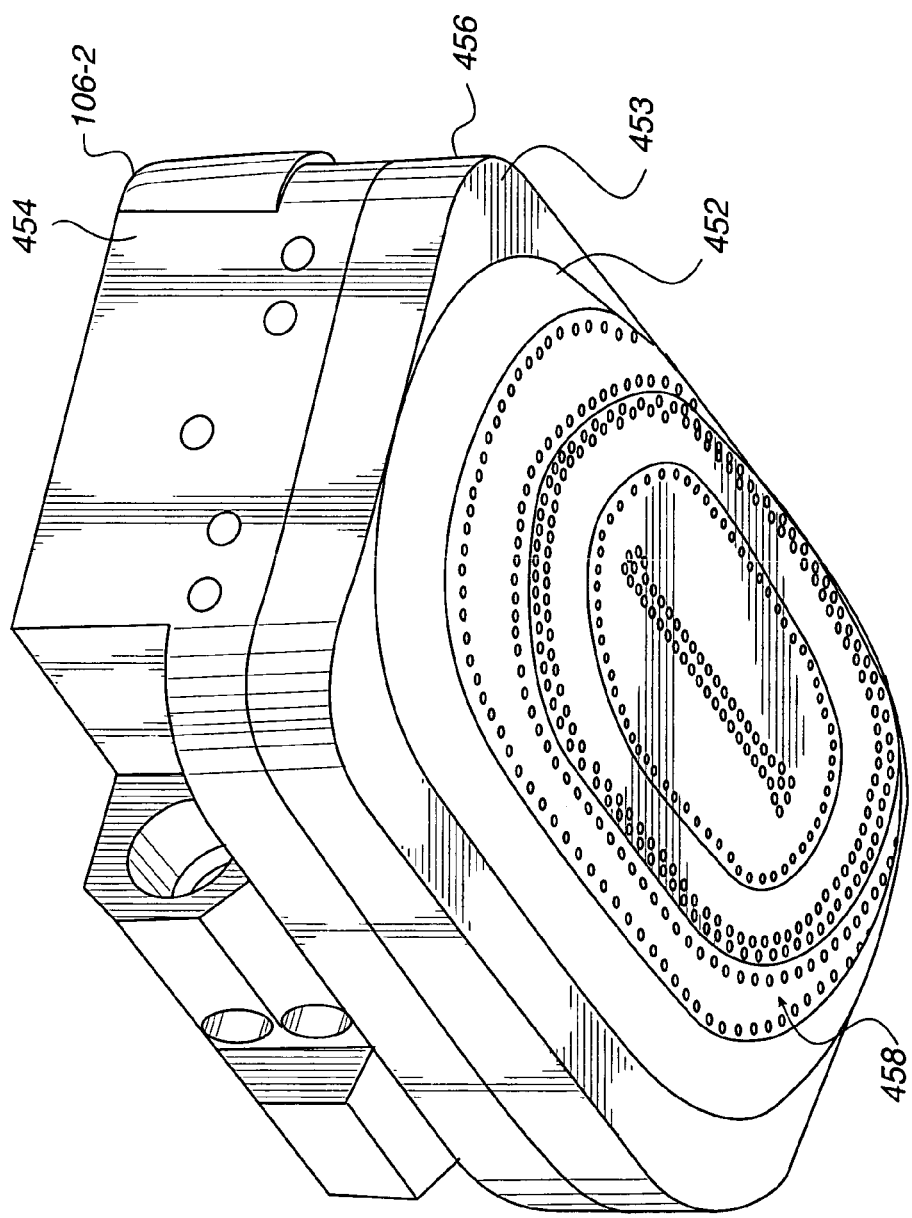
FIG. 6A illustrates a multi-menisci proximity head in accordance with one embodiment of the present invention.

FIG. 6A illustrates a multi-menisci proximity head 106-2 in accordance with one embodiment of the present invention. The proximity head 106-2 includes, in one embodiment, a facilities plate 454 and a body 458. It should be appreciated the proximity head 106-2 may include any suitable numbers and/or types of pieces as long as the first fluid meniscus and the second fluid meniscus as described herein may be generated. In one embodiment, the facilities plate 454 and the body 458 may be bolted together or in another embodiment, the plate 454 and the body 458 may be attached by an adhesive. The facilities plate 454 and the body 458 may be made from the same material or different materials depending on the applications and operations desired by a user.

The proximity head 106-2 may include a processing surface 458 which includes conduits where fluid(s) may be applied to surface of the wafer and the fluid(s) maybe removed from a surface of the wafer. The processing surface 458 may, in one embodiment, be elevated above a surface 453 as shown by an elevated region 452. It should be appreciated that the processing surface 458 does not have to be elevated and that the surface 458 may be substantially planar with the surface 453 of the proximity head 106-2 that faces the surface of the wafer being processed.

Figure 6B:
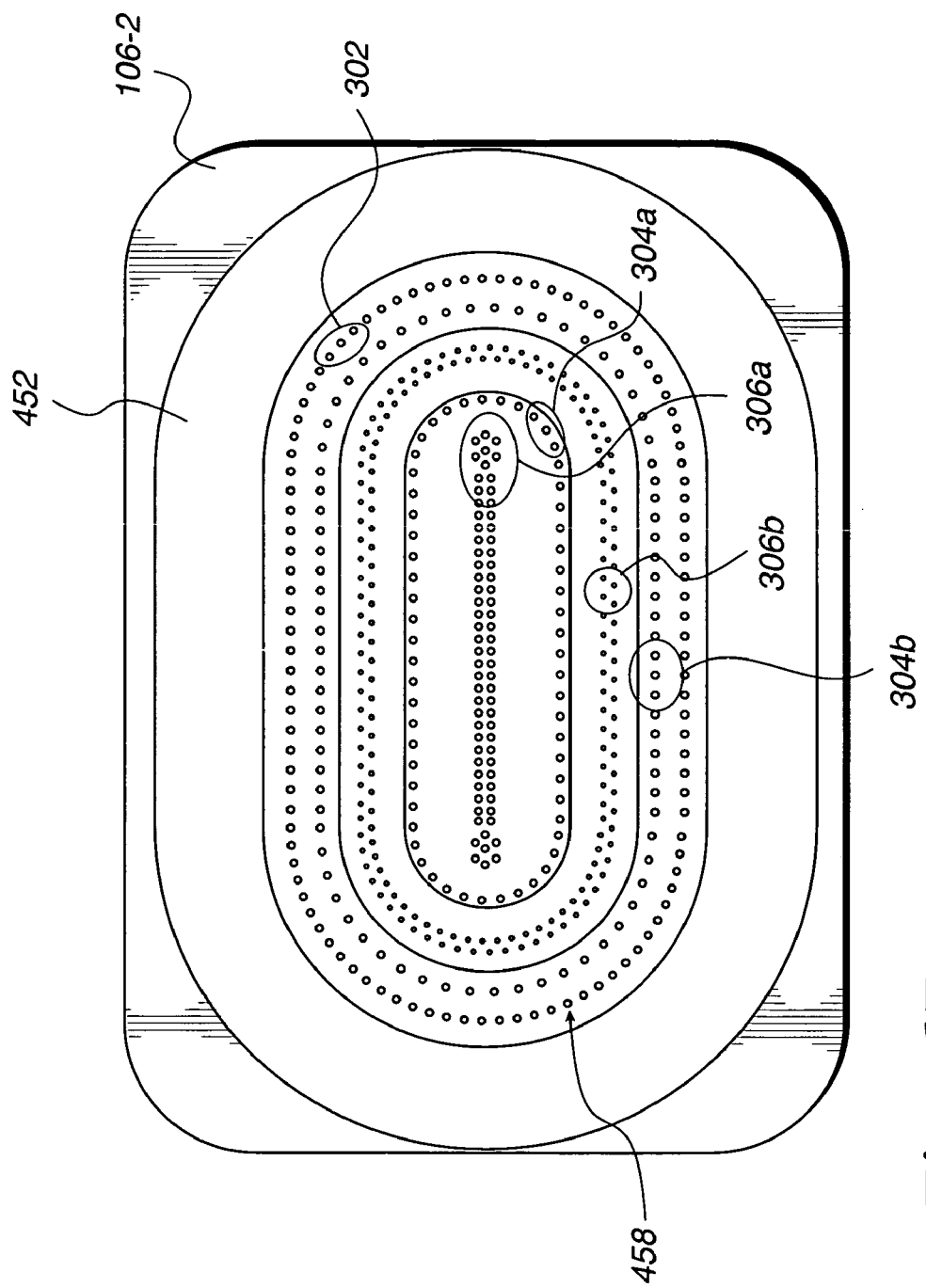
FIG. 6B illustrates the processing surface of the proximity head in accordance with one embodiment of the present invention.

FIG. 6B illustrates the processing surface 458 of the proximity head 106-2 in accordance with one embodiment of the present invention. In one embodiment, the processing surface 458 is a region of the proximity head 106-2 which generates the fluid menisci. The processing surface 458 may include any suitable number and type of conduits so the first fluid meniscus and the second fluid meniscus may be generated. In one embodiment, the processing surface 458 includes fluid inlets 306a, fluid outlets 304a, fluid inlets 306b, fluid outlets 304b, and fluid inlets 302.

The fluid inlets 306a may apply a first fluid to the surface of the wafer, and the fluid inlets 306b may apply a second fluid to the surface of the wafer. In addition, the fluid outlets 304a may remove the first fluid and a portion of a second fluid from the surface of the wafer by the application of vacuum, and the fluid outlets 304b may remove a portion of the second fluid from the surface of the wafer by the application of vacuum, and the fluid inlets 302 may apply a fluid that can decrease the surface tension of the second fluid. The first fluid and/or the second fluid may be any suitable fluid that can facilitate any one of a lithography operation, an etching operation, a plating operation, a cleaning operation, a rinsing operation, and a drying operation.

Figure 6C:
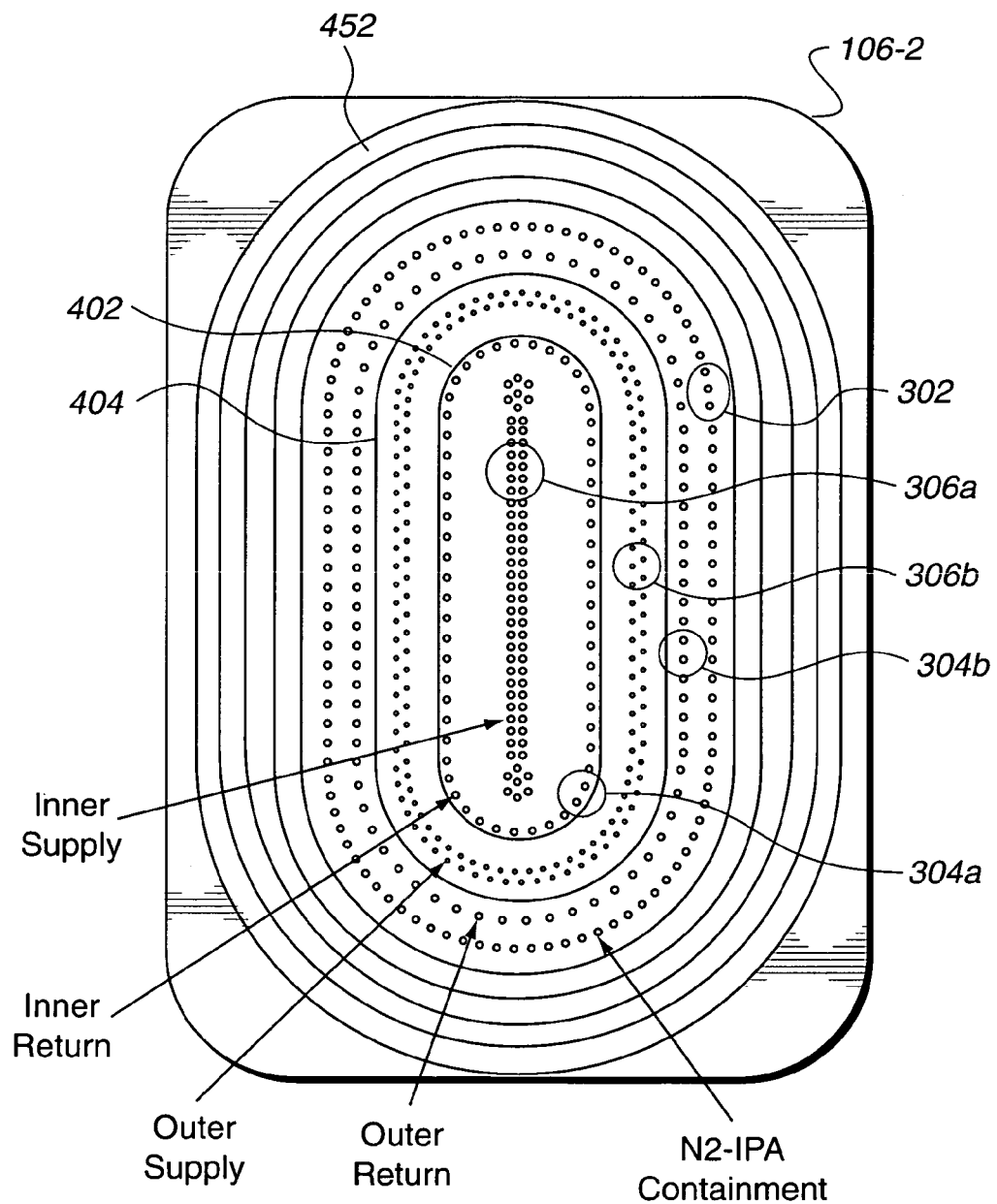
FIG. 6C shows a closer view of the processing surface of the multi-menisci proximity head in accordance with one embodiment of the present invention.

FIG. 6C shows a closer view of the processing surface 458 of the multi-menisci proximity head 106-2 in accordance with one embodiment of the present invention. In one embodiment, the processing surface 458 includes a first fluid meniscus region 402 which includes the fluid inlets 306a and fluid outlets 304a. The processing surface 458 also includes a second fluid meniscus region 404 includes the fluid inlets 306b and the fluid outlets 304b and the fluid inlets 302. Therefore, the first fluid meniscus region 402 can generate the first fluid meniscus and the second fluid meniscus region 404 can generate the second fluid meniscus.

Figure 6D:
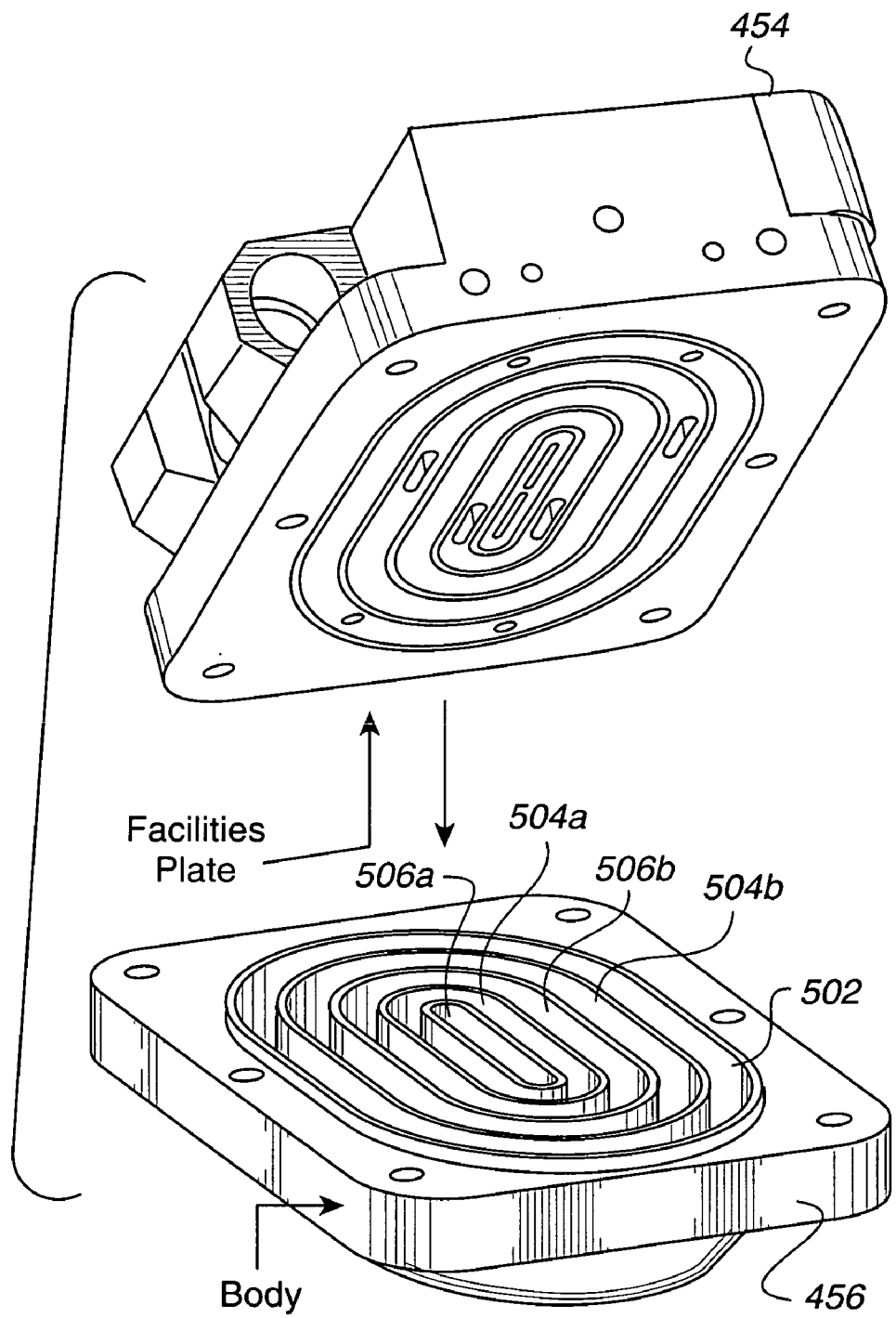
FIG. 6D shows the facilities plate attaching to the body to form the multi-menisci proximity head in accordance with one embodiment of the present invention.

FIG. 6D shows the facilities plate 454 attaching to the body 456 to form the multi-menisci proximity head 106-2 in accordance with one embodiment of the present invention. Channels corresponding to the fluid inlets 306a, 304a, and 302 supply fluid from the facilities plate 454 into the body 456 of the multi-menisci proximity head 106-2, and channels corresponding to the fluid outlets 306b and 304b remove fluid from the body 456 to the facilities 454. In one embodiment channels 506a, 504a, 506b, 504b, and 502 correspond to the fluid inlets 306a, fluid outlets 306b, fluid inlets 304a, fluid outlets 304b, and fluid inlets 302.

Figure 6E:
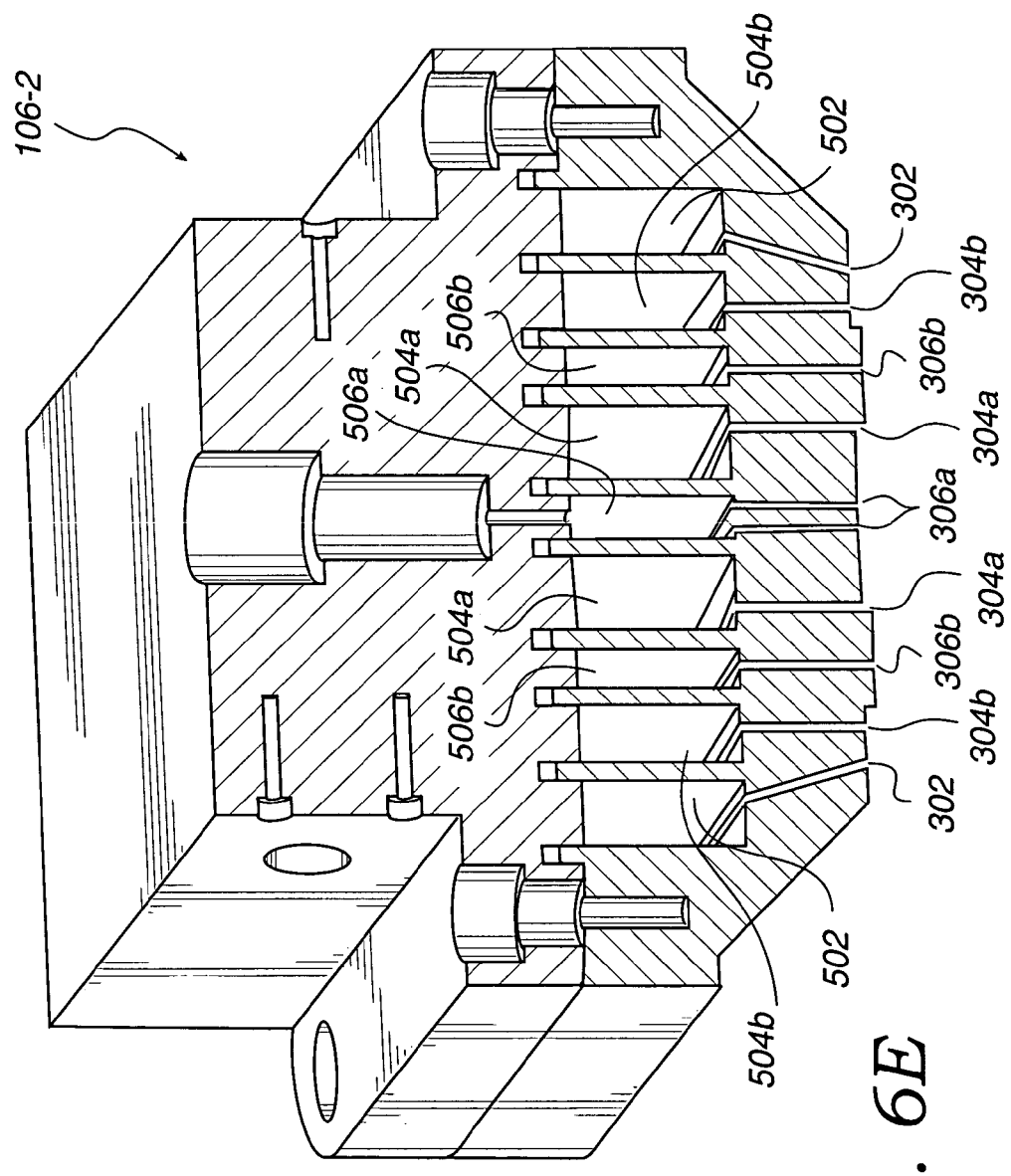
FIG. 6E illustrates a cross section view of the proximity head in accordance with one embodiment of the present invention.

FIG. 6E illustrates a cross section view of the proximity head 106-2 in accordance with one embodiment of the present invention. As described in reference to FIG. 6D, channels 506a, 506b, and 502 may supply a first fluid, a second fluid, and a third fluid to fluid inlets 306a, 306b, and 302 respectively. In addition, a channel 504a may remove a combination of the first fluid and the second fluid from the fluid outlets 304a, and channel 504b may remove combination of the second fluid and the third fluid from the outlets 304b. In one embodiment, the first fluid is a first processing fluid that can conduct any suitable operation on a wafer surface such as, for example, etching, lithography, cleaning, rinsing, and drying. The second fluid is a second processing fluid that may or may not be the same as the first fluid. As with the first fluid, the second fluid may be any suitable type of processing fluid such as, for example, a fluid that can facilitate etching, lithography, cleaning, rinsing, and drying.

Figure 7:
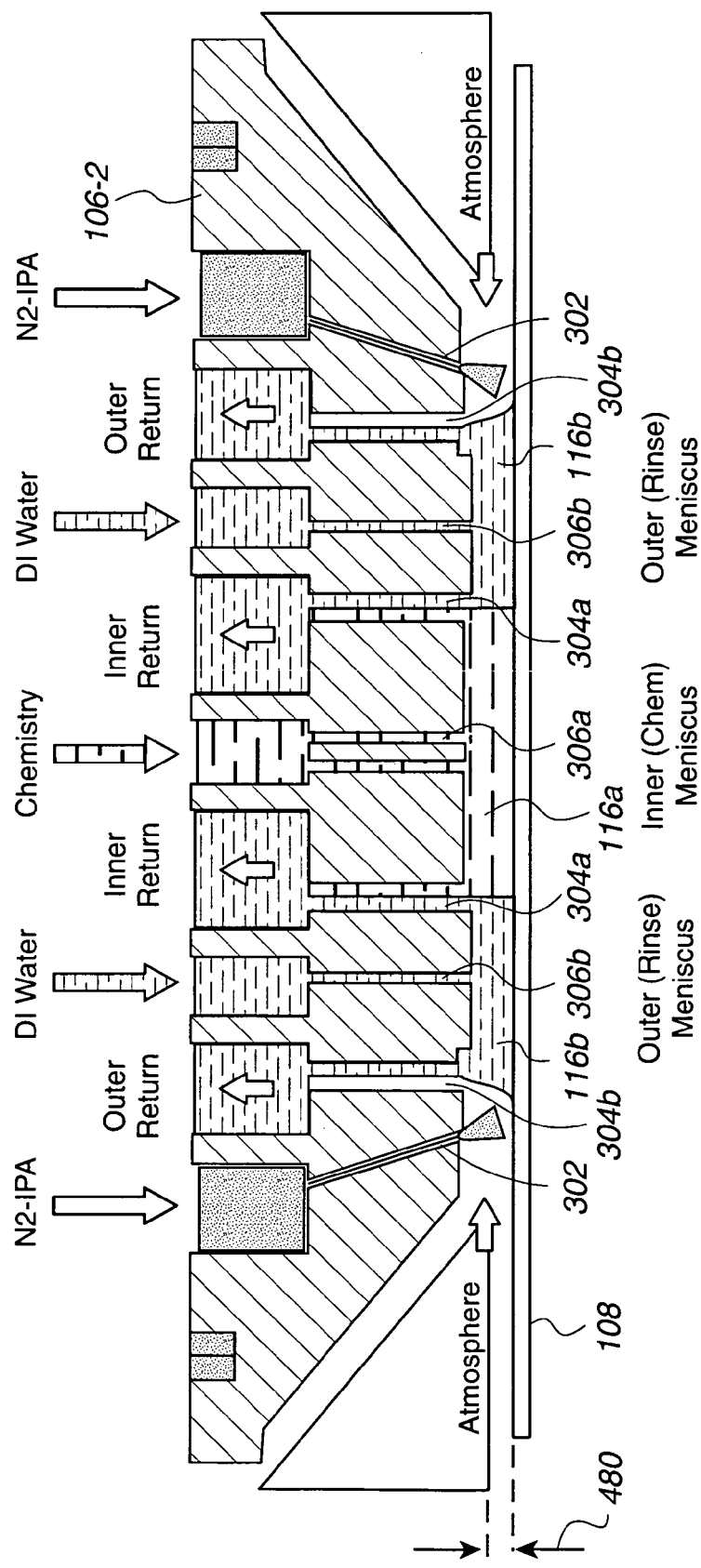
FIG. 7 illustrates a cross-sectional view of the multi-menisci proximity head in exemplary wafer processing operations in accordance with one embodiment of the present invention.

FIG. 7 illustrates a cross-sectional view of the multi-menisci proximity head in exemplary wafer processing operations in accordance with one embodiment of the present invention. Although FIG. 7 (and also FIG. 8A) shows a top surface of the wafer 108 being processed, it should be appreciated by those skilled in the art that both a top surface and a bottom surface of the wafer 108 may be concurrently processed by any of the proximity heads described herein on the top surface of the wafer 108 and by any of the proximity heads described herein on the bottom surface of the wafer 108. In one embodiment, a first wafer processing chemistry is applied to the wafer 108 through fluid inlet 306a. After the first wafer processing chemistry has processed the wafer surface, the first wafer processing chemistry is removed from the wafer surface through the fluid outlet 304a. The first wafer processing fluid may form a first fluid meniscus 116a between the multi-menisci proximity head 106-2 and the wafer 108. In one embodiment, a second processing fluid such as, for example, deionized water (DIW) is applied to the wafer surface through the fluid inlets 306b.

As discussed above, the second processing fluid may be any suitable fluid that can accomplish the desired operation on the wafer surface. After the DIW has processed the wafer surface, the DIW is removed from the wafer surface through both the source outlets 304a and 304b. The DIW between the multi-menisci proximity head 106-2 and the wafer surface may form a second fluid meniscus 116b.

In one embodiment, a surface tension reducing fluid such as, for example, isopropyl alcohol vapor in nitrogen gas may optionally be applied from the source inlet 302 to the wafer surface to keep the liquid/gas border of the second fluid meniscus 116b stable. In one embodiment, the second fluid meniscus 116b can substantially surround the first fluid meniscus 116a. In this way, after the first fluid meniscus 116a has processed the wafer surface, the second fluid meniscus 116b can nearly immediately begin operating on a portion of the wafer surface already processed by the first fluid meniscus 116a. Therefore, in one embodiment, the second fluid meniscus 116b forms a concentric ring around the first fluid meniscus 116a. It should be appreciated that the first fluid meniscus 116a may be any suitable geometric shape such as, a circle, ellipse, square, rectangle, triangular, quadrilateral, linear, etc. The second fluid meniscus 116b can be configured to at least partially surround whatever shape the first fluid meniscus 116a may be. It should be appreciated that, as discussed above, the first fluid meniscus 116a and/or the second fluid meniscus 116b may utilize any suitable fluid(s) depending on the wafer processing operation desired.

It should be appreciated that to generate a stable fluid meniscus, an amount of the first fluid inputted into the first fluid meniscus through the source inlets 306a should be substantially equal to the amount of the first fluid removed through the source outlets 304a. The amount of the second fluid inputted into the second fluid meniscus through the source inlets 306b should be substantially equal to the amount of the second fluid removed through the source outlets 304a and 304b. In one embodiment, the flow rate of the fluids are determined by a distance 480 the proximity head 106-2 is off of the wafer 108. It should be appreciated that the distance 480 may be any suitable distance as long as the menisci can be maintained and moved in a stable manner. In one embodiment, the distance 480 may be between 50 microns and 5 mm, and in another embodiment 0.5 mm to 2.5 mm. Preferably, the distance 480 is between about 1 mm and 1.5 mm. In one embodiment, the distance 480 is about 1.3.

The flow rates of the fluids as shown in FIG. 7 may be any suitable flow rate that can generate the first fluid meniscus and the second fluid meniscus that substantially surrounds the first meniscus. Depending on the distinction desired between the first fluid meniscus and the second fluid meniscus, the flow rates may differ. In one embodiment, source inlets 306a may apply the first fluid at a flow rate of about 600 cc/min, source inlets 306b may apply the second fluid at a flow rate of about 900 cc/min, a source outlets 304a may remove the first fluid and the second fluid at a flow rate of about 1200 cc/min, and the source outlets 304b may remove both the second fluid at a flow rate of 300 cc/min and atmosphere (which may include some IPA vapor in $N_2$ if such a surface tension reducing fluid is being applied to the wafer surface). In one embodiment, the flow rate of fluids through the source outlets 304 may equal 2 times the flow rate of fluid through the source inlets 306a. The flow rate of fluid through the source inlets 306b may be equal to the flow rate through the source inlets 306a plus 300. It should be appreciated by those skilled in the art that specific flow rate relationships of the source inlets 306a, 306b and source inlets 304a, 304b may change depending on the configuration of the process area and/or the configuration of the proximity heads described herein.

FIGS. 8A through 12 show further embodiments of the proximity head that include a barrier to separate menisci when the proximity head is in operation. The barrier may be located between a set of inlets/outlets that produce one meniscus and a set of inlets/outlets that produce another meniscus. Therefore, when multiple adjacent menisci are desired to be generated but kept separated from each other, the barrier can assist in the managing of both the separability and stability of the menisci.

Many cleaning applications in semiconductor device manufacturing are not performed with dilute aqueous chemistries. In wafer processing, e.g., for post-etch residue removal, the wafer can be exposed to a class of chemicals called semi-aqueous ("SA solvents"), which may include, for example, ATMI ST-255 and ATMI PT-15 (made by ATMI of Danbury, Conn.), EKC5800™ (made by EKC Technology in Danville, Calif.), etc. While the specific nature of these chemicals may be different depending on the specific chemical compositions, as a class they can have some characteristics such that SA solvents may be expensive, chemical performance is often strongly degraded by exposure to water and typically only small amounts of the chemicals are needed to treat the wafer. Due to the often costly nature of SA chemicals, it is typically desired to reclaim these chemicals. Reclaim is similar to recycle where an amount of chemistry is applied to the wafer and the excess or unused amount is drawn off and saved for the next wafer.

Also, the chemical activity of these chemistries is generally extremely dependent on concentration (dilution results in significantly lower chemical activity), and the lifetime of SA solvents is often very dependent on water content (higher exposure to water=lower lifetime). Therefore, in order to minimize the amount of chemistry used per wafer, and to maximize number of wafers that can be treated with a batch of SA chemistry, it is desirable to separate the dispensing/application of SA solvents to a wafer and the rinsing of the SA solvents off that wafer.

FIG. 8A illustrates a cross-sectional view of the multi-menisci proximity head 106-3 which is utilized to process a phobic barrier 602 in accordance with one embodiment of the present invention. In one embodiment, the multi-menisci proximity head 106-3 includes fluid inlets 306a, 306b and fluid outlets 304a, 304b, and optionally fluid inlet 302. As discussed in reference to FIG. 6, the fluid inlets 306a can apply a first processing fluid to the wafer surface. It should be appreciated that the first fluid may be any suitable fluid that can process the wafer surface in the wafer processing operation desired. Therefore, in one embodiment, the first fluid may be any one of a lithography enhancing fluid, an etching fluid, a cleaning fluid, a rinsing fluid, and a drying fluid. In addition, in an optional embodiment, the fluid inlets 302 can apply a third fluid to the wafer surface. After the processing fluid has operated on the wafer surface, the processing fluid is removed, in one example, by vacuum through the fluid outlets 304a. After the wafer processing chemistry has processed the wafer surface, the wafer processing chemistry is removed from the wafer surface through the fluid outlets 304a.

The multi-menisci proximity head 106-3 may also apply a second wafer processing fluid to the surface through the fluid inlets 306b and remove the second wafer processing fluid from the surface by, in one embodiment, a vacuum applied through the fluid outlets 304a and 304b. In this way, the second fluid meniscus 116b may be generated. It should be appreciated that the second fluid may be any suitable fluid that can process the wafer surface in the wafer processing operation desired. Therefore, in one embodiment, the second fluid may be any one of a lithography enhancing fluid, an etching fluid, a cleaning fluid, a rinsing fluid, and a drying fluid. In addition, in an optional embodiment, the fluid inlets 302 can apply a third fluid to the wafer surface. It should be appreciated that the third fluid may be any suitable fluid that can reduce the surface tension of the second fluid. In one embodiment, the third fluid is isopropyl alcohol vapor in nitrogen gas (IPA/$N_2$).

In one embodiment of the multi-menisci proximity head 106-3, a phobic barrier 602 is located between the fluid outlet 304a and the fluid inlet 306b. The wafer processing fluid forms a first fluid meniscus 116a between the multi-menisci proximity head 106-2. In one embodiment, deionized water (DIW) is applied to the wafer surface through the fluid inlets 306b. After the DIW has processed the wafer surface, the DIW is removed from the wafer surface through the source outlet 304b. The DIW between the multi-menisci proximity head 106-2 and the wafer surface forms a second fluid meniscus 116b. Isopropyl alcohol vapor in nitrogen gas may optionally be applied to the wafer surface to keep the liquid/gas border of the second fluid meniscus 116b stable. In one embodiment, the second fluid meniscus 116b substantially surrounds the first fluid meniscus 116a. In this way, after the first fluid meniscus 116a has processed the wafer surface, the second fluid meniscus 116b can nearly immediately begin operating on a portion of the wafer surface already processed by the first fluid meniscus 116a.

Figure 8B:
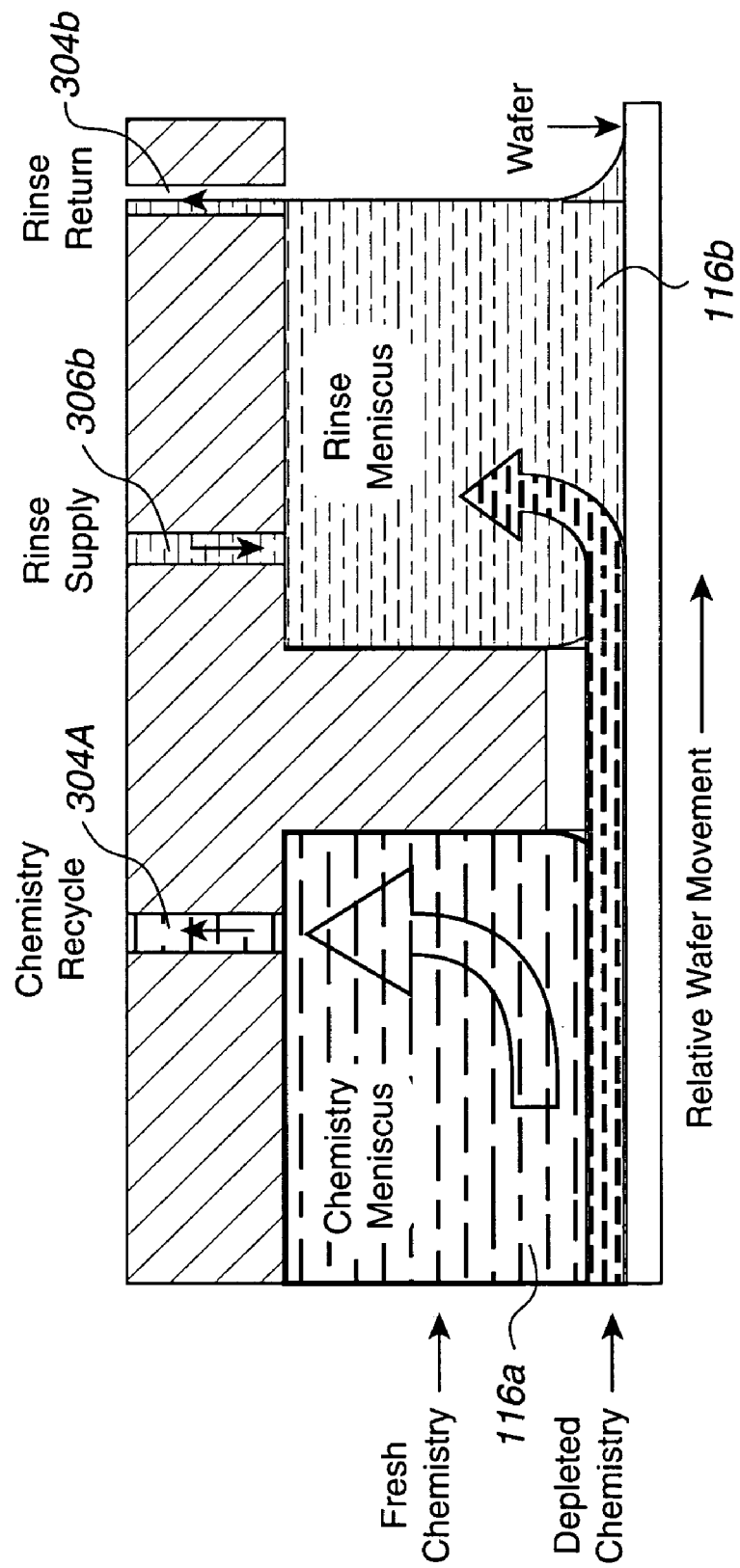
FIG. 8B illustrates a close up view of the multi-menisci proximity head operating on a philic wafer surface in accordance with one embodiment of the present invention.

The embodiment as shown in FIG. 8A includes the phobic barriers 602 which can separate the first fluid meniscus 116a and the second fluid meniscus 116b. In such an embodiment, the first fluid meniscus 116a may not directly contact the second fluid meniscus 116b. As discussed in further reference to FIG. 8B below, depleted fluid from the first fluid meniscus 116a that has processed the wafer surface may be remain on the wafer surface for removal by the second fluid meniscus 116b. It should be appreciated that the barrier 602 may be made from any suitable material that is phobic to the fluids, such as, for example, SA solvents, aqueous solutions, water solutions, etc., to be utilized to generate the fluid menisci.

Consequently, in one embodiment, when SA solvents are used to generate the fluid meniscus 116a, the SA solvent meniscus may be separated from the adjacent rinse meniscus. In addition, in the embodiment where SA solvent is utilized, the phobic barriers 602 enable reclamation of SA solvent and enables rinsing of the depleted boundary layer.

The barrier 602 may also prevent free air flow in the gap between the menisci thereby eliminating drying off intermenisci films and hence dramatically reduces the chance of defects forming on the wafer surface. In addition, the barrier may be made very thick so the amount of liquid at risk of uncontrolled drying is minimized.

FIG. 8B illustrates a close up view of the multi-menisci proximity head 106-3 operating on a philic wafer surface in accordance with one embodiment of the present invention. In one embodiment, the multi-menisci proximity head 106-3 includes the first fluid meniscus 116a that can process the wafer surface in whatever type of wafer processing operation desired as discussed above. The depleted chemistry from the first fluid meniscus 116a remaining on the wafer surface can then be processed by the second fluid meniscus 116b (which in one embodiment as shown is a rinsing fluid meniscus to remove the depleted chemistry). The embodiment shown is related to processing of hydrophilic wafers that can hold onto the depleted chemistry when the first fluid meniscus 116a moves off of the processing area of the wafer surface.

In one embodiment, the barrier is phobic to the chemistry of the first fluid meniscus and the wafer is philic to the chemistry of the first fluid meniscus. In this case, when, for example, the chemistry is the SA solvent, the phobic barrier may be engineered so as to allow only the "depleted" surface layer to pass into the rinse meniscus (e.g., DIW meniscus) to result in optimized solvent recycling and maximum solvent lifetime. Specific parameters for the barrier 602 may be any suitable shape (height, width, profile, dimensions), location, surface finish, etc., that can keep the first fluid meniscus and the second fluid meniscus substantially separated.

Figure 8C:
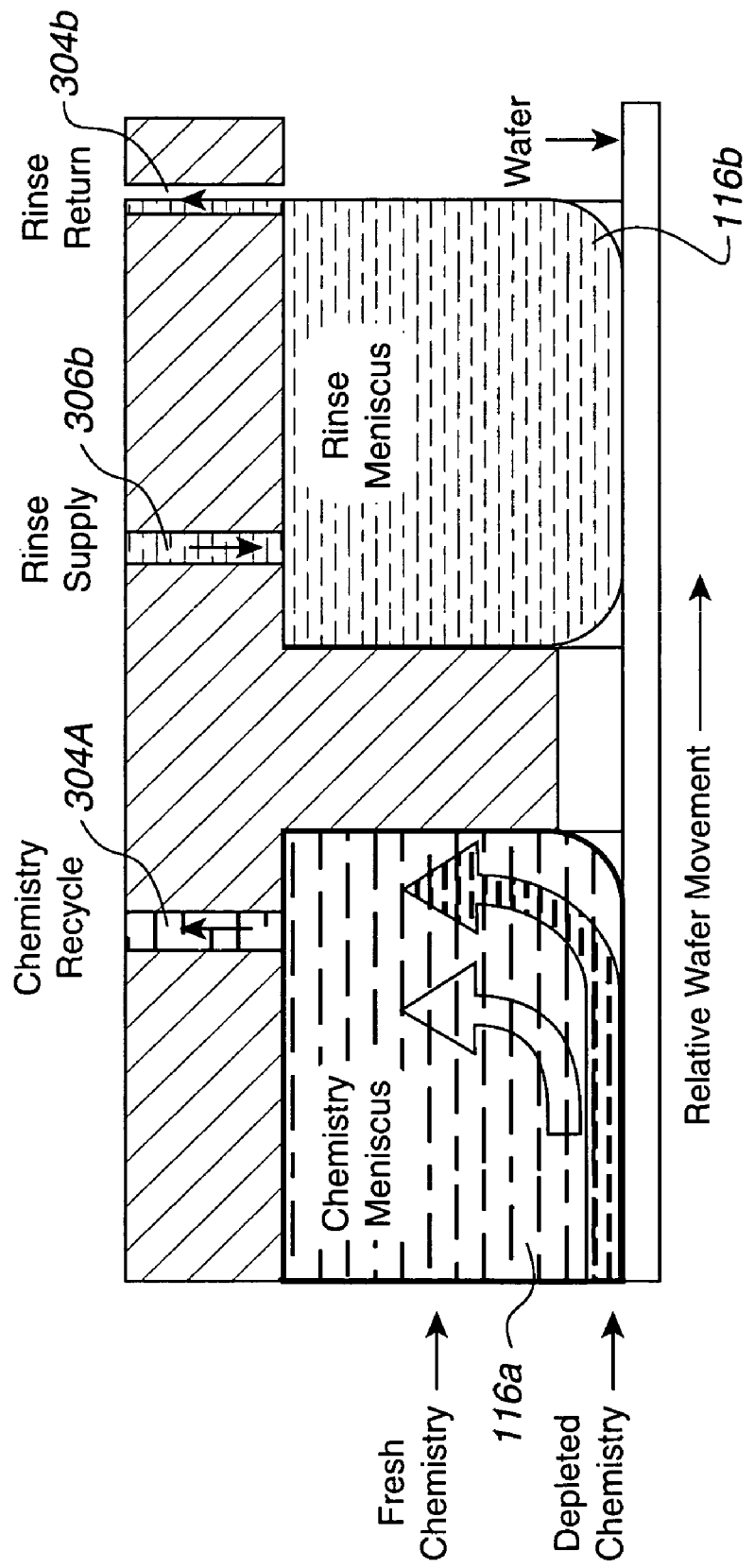
FIG. 8C shows a close-up view of the multi-menisci proximity head operating on a phobic wafer surface in accordance with one embodiment of the present invention.

FIG. 8C shows a close-up view of the multi-menisci proximity head 106-3 operating on a phobic wafer surface in accordance with one embodiment of the present invention. In this embodiment, the wafer processing chemistry (which in one embodiment is an aqueous fluid) of the first fluid meniscus 116a does not stay on the wafer surface after processing because the wafer surface is phobic to the fluid making up the first fluid meniscus 116a. Therefore, the phobic barrier 602 can keep the first fluid meniscus 116a and the second fluid meniscus 116b totally separated so there is no intermixing of the fluid of the first fluid meniscus 116a with the fluid of the second fluid meniscus 116b. In addition the source outlets 304 in such an embodiment only removes the first fluid from the first fluid meniscus 116a.

It should be appreciated that although only two menisci (inside meniscus and outside surrounding meniscus) are shown in the exemplary embodiments that any suitable number of concentric menisci can be generated. In such a case each of the inner menisci may be generated by a set of at least one source inlet 306a and the source outlet 304a while the last surrounding meniscus (the last outside meniscus that would surround the menisci) may have a set of at least one source inlet 306b and 304b. Any inner menisci may be generated by a set of source inlets 306a and the source outlets 304a that can apply and remove a particular processing fluid.

In one embodiment, when the SA solvent is utilized as the chemistry of the first fluid meniscus 116a, the phobic barrier could result in almost 100% recovery of the SA solvent (i.e. bulk and depleted surface layer). If the rinse water were more philic to the wafer than the SA solvent, the relative movement of the wafer may prevent rinse water from contaminating the SA solvent. The barrier 602 may be designed to allow for a relatively large "minimum distance" between the barrier and wafer, or the barrier could extend down to the wafer surface to "squeegee" the SA solvent for maximum recycling.

Figure 9A:
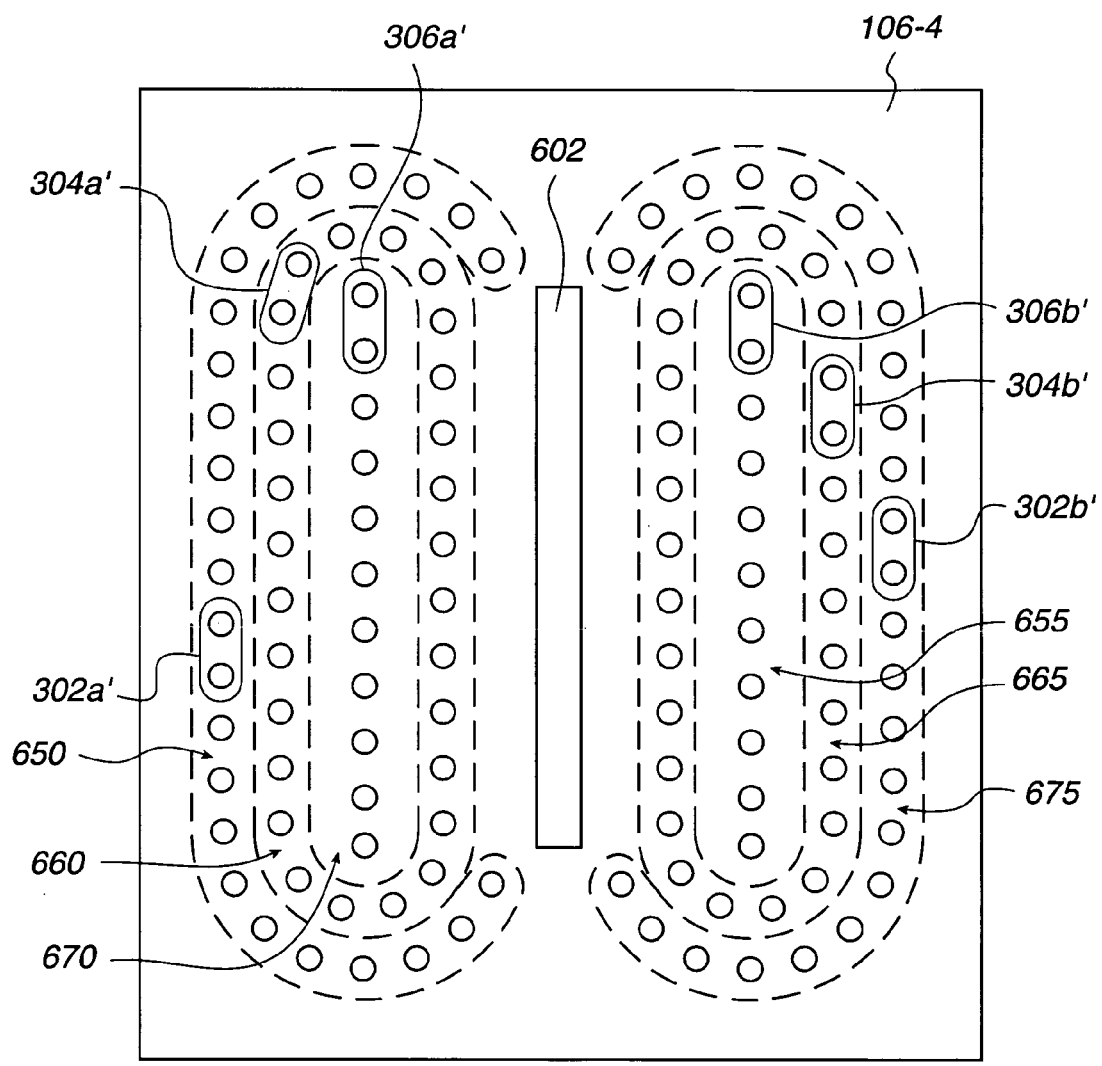
FIG. 9A illustrates a proximity head with an exemplary inlet/outlet pattern including the barrier in accordance with one embodiment of the present invention.

FIG. 9A illustrates a proximity head 106-4 with an exemplary inlet/outlet pattern including the barrier 602 in accordance with one embodiment of the present invention. In one embodiment, the proximity head 106-4 includes a plurality of source inlets 306a' and 306b'. The plurality of source inlets 306a' may be located in a region 670 while the plurality of source inlets 306b' may be located in a region 655. The proximity head 106-4 may also include a plurality of source outlets 304a' and 304b'. The plurality of source outlets 304a' and 304b' may be located in a region 660 and a region 665 respectively. In one embodiment, the proximity head 106-4 may optionally include plurality of source inlets 302a' and 302b' which can be located in regions 650 and 675 respectively. It should be appreciated that the plurality of source inlets 306a' may apply any suitable type of fluids to a wafer surface. In addition, the plurality of source inlets 306b' may apply the same type of fluid as the plurality of source inlets 306a' while in another embodiment, the plurality of source inlets 306b' may be configured to apply different types of fluid to the wafer than the fluid applied by the plurality of source inlets 306a'.

In one embodiment, the plurality of source outlets 304a' may be configured to remove the fluid applied to the wafer from the plurality of source inlets 306a', and the plurality of source outlets 304b' may be configured to remove fluid applied to the wafer from the plurality of source inlets 306b'. It should be appreciated that both the plurality of source inlets 306a' and 306b' may remove other fluids or materials that may also be on the surface. The barrier 602 in one embodiment, may be entirely hydrophobic and in another embodiment, may be partially hydrophobic and partially hydrophilic as discussed, for example, in FIG. 9C. It should be appreciated that although the barrier 602 is exemplified in a rectangular form, the barrier 602 can be in any suitable size and shape as long as the barrier 602 can separate two or more menisci. It should also be understood that the barrier 602 may be made at least partially out of hydrophobic materials such as, for example, PTFE, PVDF, polypropylene, polycarbonate, polyimide, etc. The barrier can also be located in any suitable location as long as the barrier 602 can separate fluid menisci. In one embodiment, the barrier 602 is defined between a first set of conduits of the proximity head for generating a first fluid meniscus and a second set of conduits of the proximity head for generating the second fluid meniscus. It should also be appreciated that the barrier 602 may be defined in or on the proximity head in any suitable manner so that the barrier 602 can separate one fluid meniscus from another fluid meniscus.

Figure 9B:
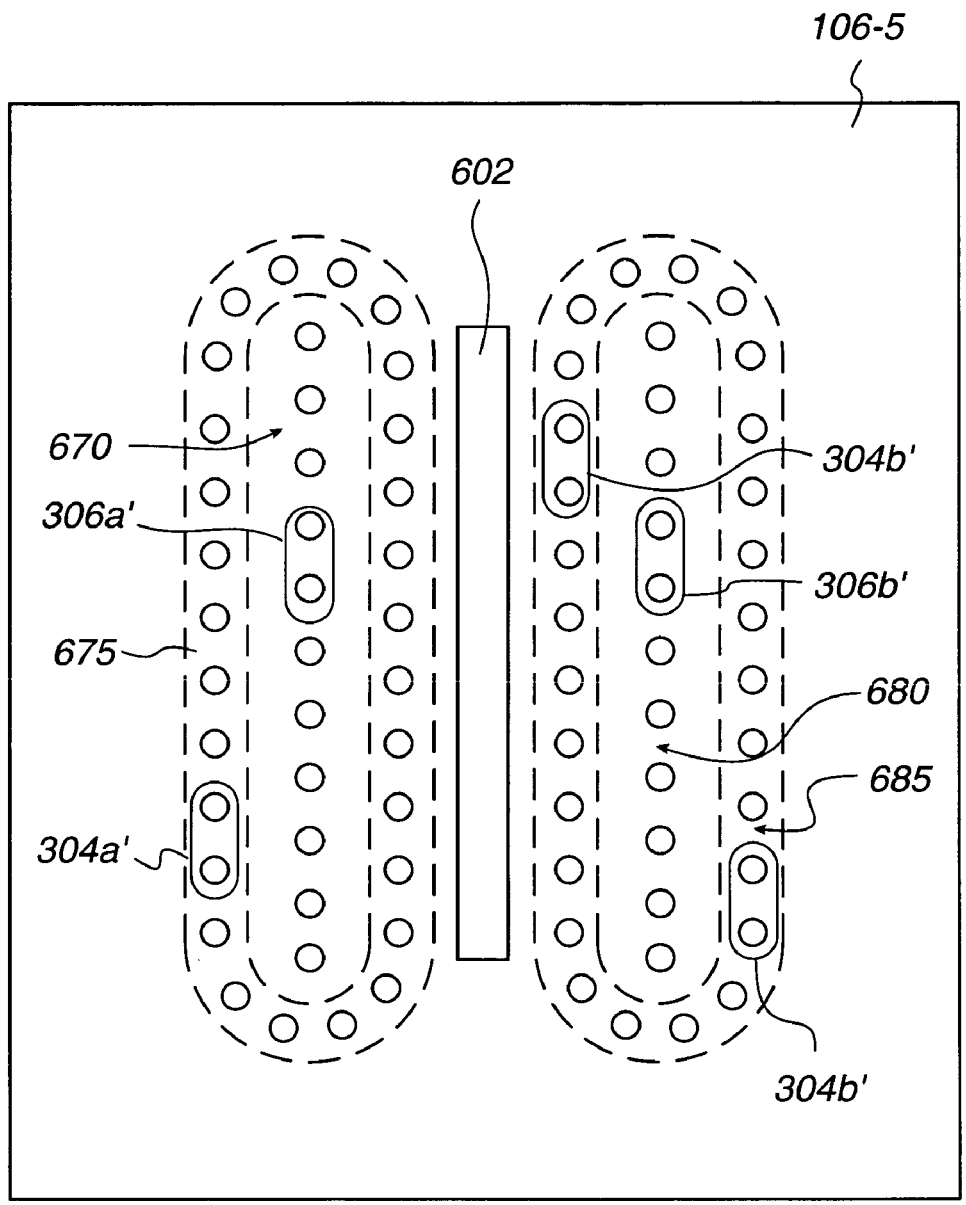
FIG. 9B shows an additional exemplary proximity head with an exemplary inlet/outlet pattern with a barrier in accordance with one embodiment of the present invention.

FIG. 9B shows an additional exemplary proximity head 106-5 with an exemplary inlet/outlet pattern with a barrier 602 in accordance with one embodiment of the present invention. In one embodiment, the proximity head 106-5 includes a plurality of source inlets 306a' and 306b' which may be located in regions 670 and 680 respectively. The proximity head 106-5 may also include a plurality of source outlets 304a' and 304b'. In one embodiment, the proximity head 106-5 may optionally include plurality of source inlets 304a' and 304b' which may be located in regions 675 and 685 respectively. It should be appreciated that the plurality of source inlets 306a' may apply any suitable types of fluids to a wafer surface. In addition, the plurality of source inlets 306b' may apply the same type of fluid as the plurality of source inlets 306a' and in another embodiment, the plurality of source inlets 306b' may be configured to apply different types of fluid to the wafer than the plurality of source inlets 306a'.

Figure 10:
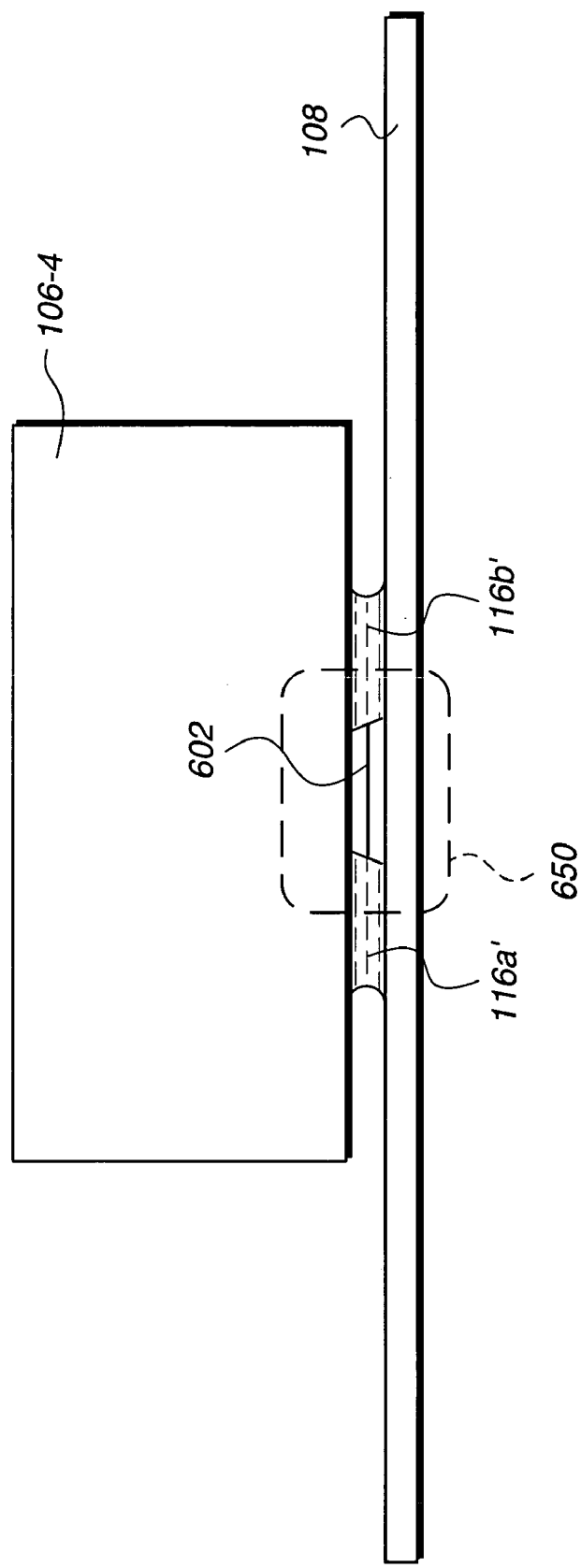
FIG. 10 illustrates a side view of a proximity head in operation where the barrier separates a first meniscus from a second meniscus in accordance with one embodiment of the present invention.

FIG. 10 illustrates a side view of a proximity head 106-4 in operation where the barrier 602 separates a first meniscus 116a' and a second meniscus 116b' in accordance with one embodiment of the present invention. In one embodiment, the menisci 116a' and 116b' may be formed by any suitable type of proximity head described herein with the barrier 602 such as, for example, the proximity heads as described above in FIGS. 9A and 9B.

In one embodiment, the plurality of source inlets 306a' may supply the fluid to generate the meniscus 116a' and the source inlets 306b' may supply the fluid to generate the meniscus 116b'. The plurality of source outlets 304a' may remove fluid from the meniscus 116a' and the plurality of source outlets 304b' may remove fluid from the meniscus 116b'. In one exemplary embodiment, the proximity head 106-4 may be in motion in a direction 690. It should be appreciated that the proximity head 106-4 may be moved in any suitable direction depending on the wafer processing desired. In another embodiment, the proximity head 106-4 may be kept in one location while the wafer 108 is moved. In yet another embodiment, both the proximity head 106-4 and the wafer 108 may be moved. A menisci separation region 650 is described in further detail in reference to FIGS. 11A–C.

Figure 11A:
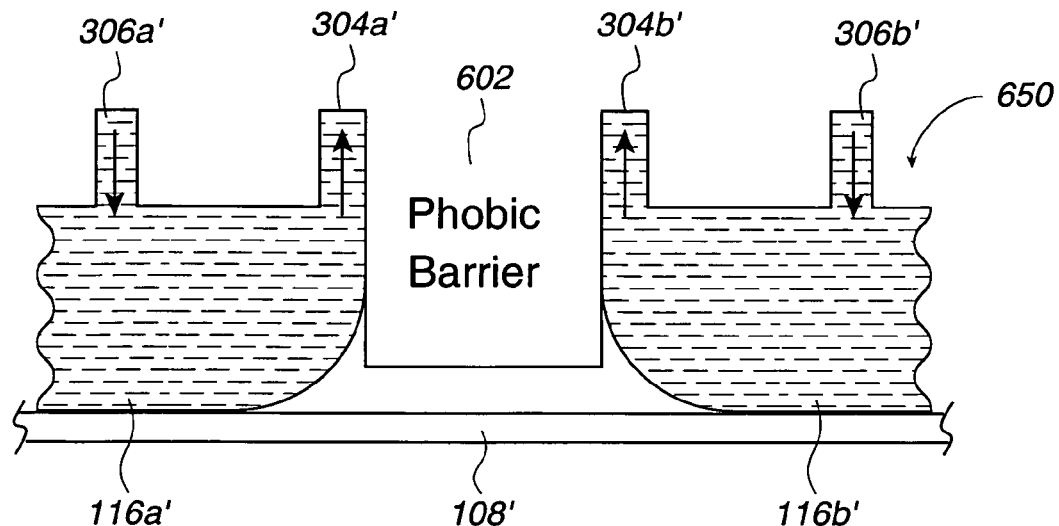
FIG. 11A shows the menisci separation region in a wafer processing operation using a hydrophobic wafer in accordance with one embodiment of the present invention.

FIG. 11A shows the menisci separation region 650 in a wafer processing operation using a hydrophobic wafer 108' in accordance with one embodiment of the present invention. The region 650 is a magnified region of the proximity head 106-4 as discussed in reference to FIG. 10 where the barrier 602 serves to separate the menisci 116a' and 116b'. In one embodiment, the barrier 602 may be hydrophobic. It should be appreciated that depending on the wafer processing operation, the barrier 602 may be made phobic to any suitable chemistry or fluid utilized in any suitable wafer processing operation. In such a circumstance the barrier 602 may be configured to repel fluid from the region occupied or near the barrier 602. Therefore, when fluid is inputted from the source inlet 304a' into the region between the proximity head 106 and the wafer 108', the fluid is repelled from the phobic barrier 602. In addition, in one embodiment, the wafer 108' is hydrophobic and therefore, the wafer 108' repels the fluid from the source inlet 304a'. Therefore, the fluid will be repelled from both the phobic barrier and the wafer 108'. As a result, due to surface tension and the repulsive interaction between the meniscus 116a' and the barrier 602 and the wafer 108', a border of the meniscus 116a' curves away from the phobic barrier and the wafer 108'. In addition, due the hydrophobic effects from the wafer 108' and the barrier 602, the menisci 116a' and 116b' do not move under the barrier 602.

While fluid is inputted into the region between the proximity head 106 and the wafer 108' from the source inlet 304a', fluid is removed from the region between the proximity head 106 and the wafer 108' through the source outlet 306a'. When fluid is inputted from the source inlet 304b' into the region between the proximity head 106-4 and the wafer 108', the fluid is repelled from the phobic barrier 602. When the wafer 108' is hydrophobic, the wafer 108' repels the fluid from the source inlet 304a'. Therefore, the fluid will be repelled from both the phobic barrier and the wafer 108'. As a result, due to surface tension and the repulsive interaction between the meniscus 116b' and the barrier 602 and the wafer 108', a border of the meniscus 116b' curves away from the barrier 602 and the wafer 108'. Consequently, the menisci 116a' and 116b' are totally separated and no intermixing of fluids from the menisci 116a' and 116b' take place.

While fluid is inputted into the region between the proximity head 106-4 and the wafer 108' from the source inlet 304a', fluid is removed from the region between the proximity head 106 and the wafer 108' through the source outlet 306a'. Consequently, the menisci 116a' and 116b' are totally separated and no intermixing of fluids from the menisci 116a' and 116b' take place.

Figure 11B:
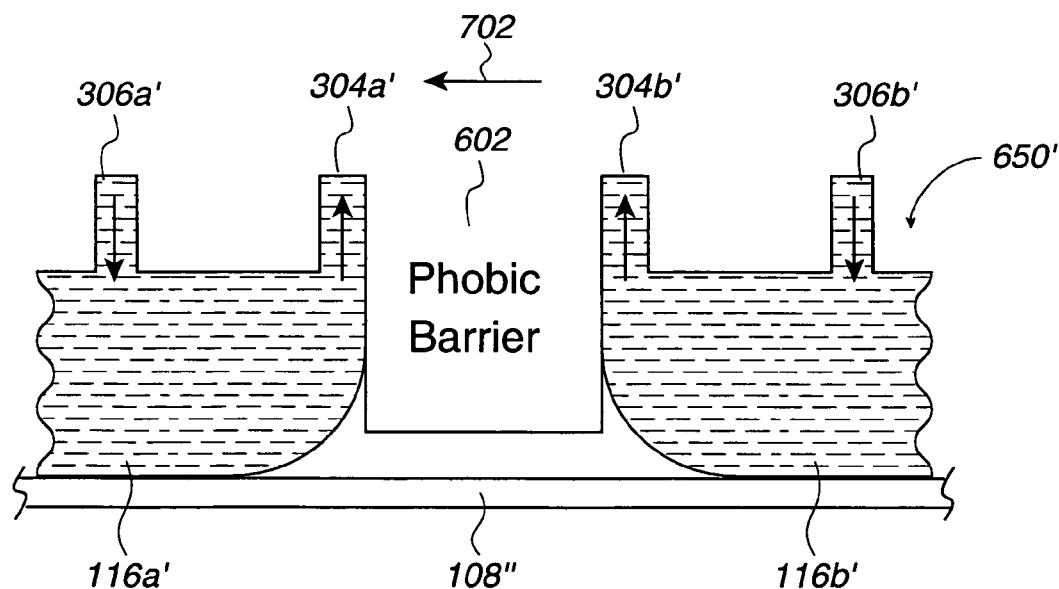
FIG. 11B shows a proximity head processing a hydrophilic wafer in accordance with one embodiment of the present invention.

FIG. 11B shows a proximity head 106-4 processing a hydrophilic wafer 108" in accordance with one embodiment of the present invention. The region 650' shown in FIG. 11B is a another exemplary embodiment of the proximity head 106-4 as discussed in reference to FIG. 10 where the barrier 602 serves to separate the menisci 116a' and 116b'. In one embodiment, the wafer 108" is hydrophilic and when the meniscus 116a' is formed by the input of fluid to the region between the proximity head 106 and the wafer 108", the fluid of the meniscus 116a' is attracted to the surface of the wafer 108". Therefore, in one embodiment, as the proximity moves in direction 702, the a thin layer of fluid on the wafer surface is moved along the wafer surface under the barrier 602. The fluid mixes with the fluid making up the fluid meniscus 116b'. It should be appreciated that the amount of fluid moving from the meniscus 116a' to 116b' is not large, therefore, if the processing of the wafer accomplished by the meniscus 116b' can withstand a small portion of fluid meniscus 116a' then the processing of the hydrophilic wafer 108" may be accomplished in a desired manner.

Figure 11C:
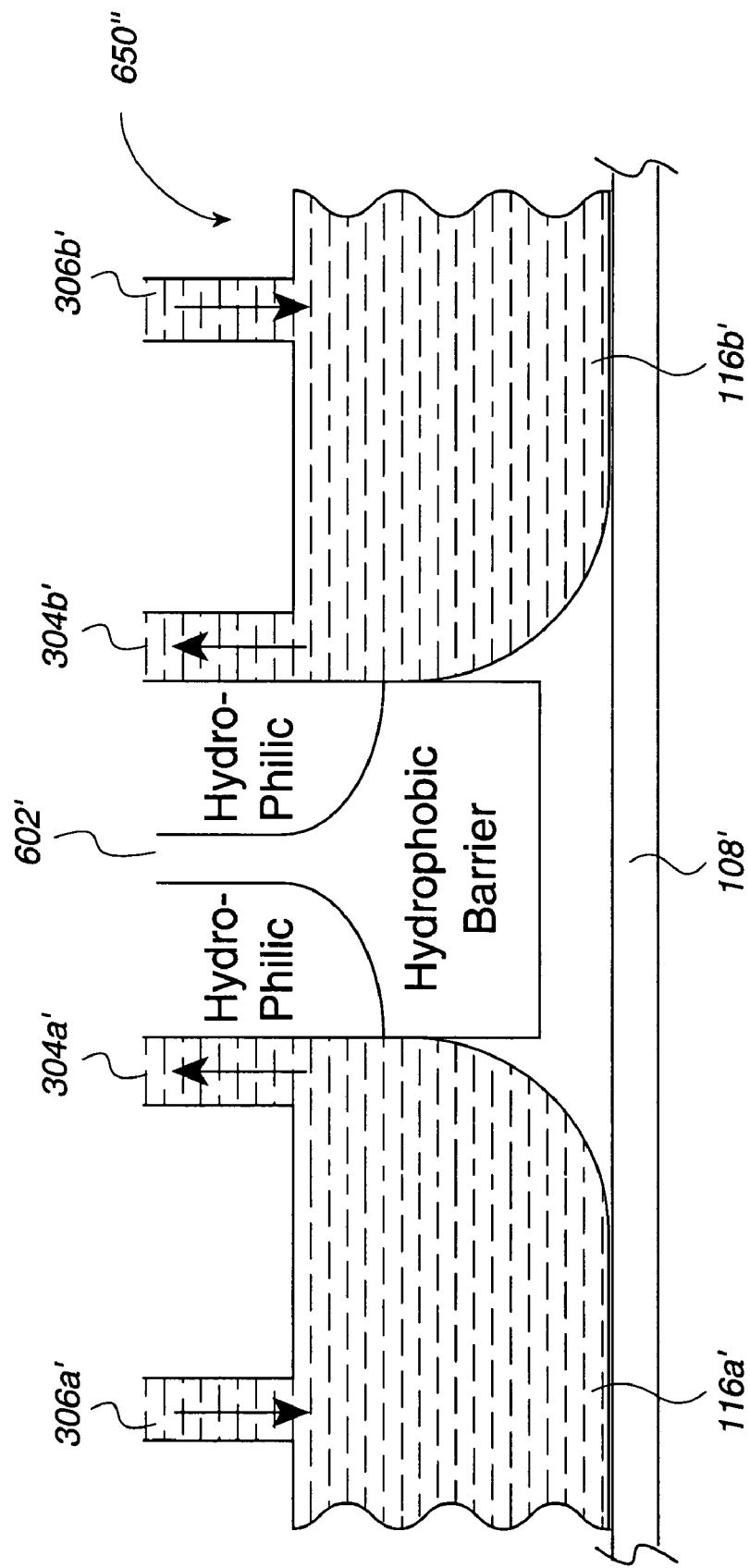
FIG. 11C shows a proximity head with a barrier that is partially hydrophilic in accordance with one embodiment of the present invention.

FIG. 11C shows a proximity head 106-4 with a barrier 602' that is partially hydrophilic in accordance with one embodiment of the present invention. The region 650" shown in FIG. 11C is a another exemplary embodiment of the proximity head 106-4 as discussed in reference to FIG. 10 where, in one embodiment, barrier 602' serves to separate the menisci 116a' and 116b'. In one embodiment, the barrier 602' may have a partially hydrophilic region 602b in addition to the hydrophobic region 602a. Therefore, the hydrophilic region 602b can attract the fluids of the menisci 116a' and 116b' respectively to shape the borders of the menisci 116a' and the 116b' in any suitable manner.

Figure 12:
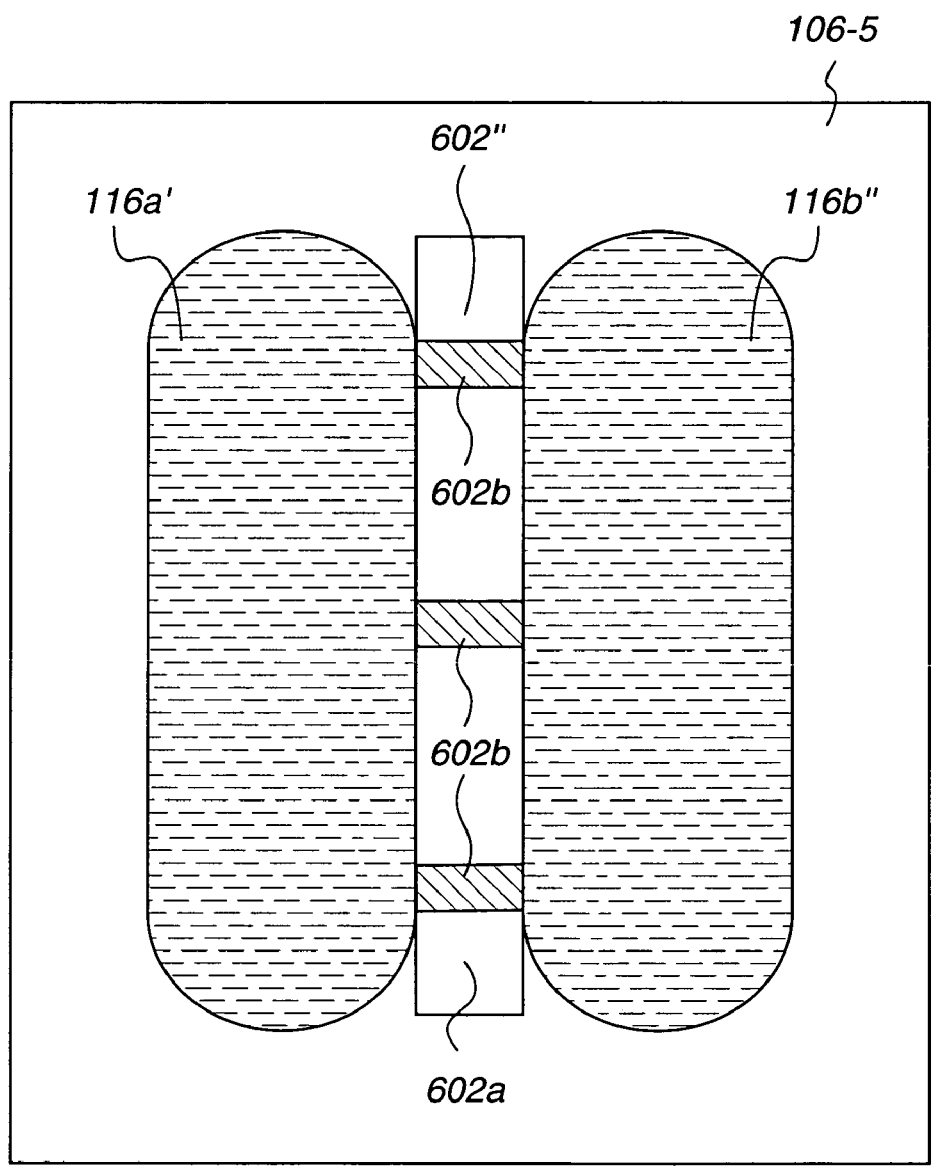
FIG. 12 illustrates a proximity head with a barrier in accordance with one embodiment of the present invention.

FIG. 12 illustrates a proximity head 106-5 with a barrier 602" in accordance with one embodiment of the present invention. In one embodiment, the barrier 602" has a hydrophilic region 602b and a hydrophobic region 602a. In one embodiment, the hydrophobic region 602a keeps apart the portions of the menisci 116a' and 116b' in the vicinity of the hydrophobic region 602a. The hydrophilic regions 602b may be configured to enable fluids from the menisci 116a' and 116b' to cross the hydrophilic region 602b. Such a configuration may be utilized in processes where it may be desirable for certain portions of the menisci 116a' and 116b' to intermix.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for processing a substrate, comprising:
generating a first fluid meniscus and a second fluid meniscus on a surface of the substrate, the first fluid meniscus being substantially adjacent to the second fluid meniscus, and the first fluid meniscus and the second fluid meniscus being generated between a surface of a proximity head and the surface of the substrate; and
substantially separating the first fluid meniscus and the second fluid meniscus with a barrier.

2. A method for processing a substrate as recited in claim 1, further comprising:
processing the surface of the substrate with the first fluid meniscus, and processing the surface of substrate with the second fluid meniscus.

3. A method for processing a substrate as recited in claim 2, wherein processing the surface of the substrate with the first fluid meniscus includes one of an etching operation, a cleaning operation, a rinsing operation, a plating operation, or a lithography operation.

4. A method for processing a substrate as recited in claim 2, wherein processing the surface of the substrate with the second fluid meniscus includes one of an etching operation, a cleaning operation, a rinsing operation, a plating operation, a drying operation, or a lithography operation.

5. A method for processing a substrate as recited in claim 1, wherein generating the first fluid meniscus includes applying a first fluid to the surface of the substrate through a first fluid inlet and removing the first fluid from the surface of the substrate through a first fluid outlet.

6. A method for processing a substrate as recited in claim 5, wherein generating the second fluid meniscus includes applying a second fluid to the surface of the substrate through a second fluid inlet and removing the second fluid from the surface of the substrate through the first fluid outlet and a second fluid outlet and applying a third fluid through a third inlet.

7. A method for processing a substrate as recited in claim 5, wherein the first fluid is one of a lithographic fluid, an etching fluid, a plating fluid, a cleaning fluid, or a rinsing fluid.

8. A method for processing a substrate as recited in claim 6, wherein the second fluid is one of a lithographic fluid, an etching fluid, a plating fluid, a cleaning fluid, a drying fluid, and or a rinsing fluid.

9. A method for processing a substrate as recited in claim 6, wherein the third fluid decreases a surface tension of the second fluid.

10. A method for processing a substrate as recited in claim 1, wherein the barrier is at least partially phobic to at least a first fluid meniscus or the second fluid meniscus.

11. A method for processing a substrate as recited in claim 1, wherein a portion of the barrier is phobic to the first fluid meniscus and a portion of the barrier is philic to the first fluid meniscus.

12. A method for processing a substrate as recited in claim 1, wherein the barrier is defined between a first set of conduits configured to generate the first fluid meniscus and a second set of conduits configured to generate the second fluid meniscus.

13. An apparatus for processing a substrate, comprising:
a proximity head including,
a first set of conduits defined within the proximity head, the first set of conduits configured to generate a first fluid meniscus between a surface of the proximity head and a surface of the substrate;
a second set of conduits defined within the proximity head, the second set of conduits configured to generate a second fluid meniscus between the surface of the proximity head and the surface of the substrate; and
a barrier defined between the first set of conduits and the second set of conduits, the barrier configured to substantially separate the first fluid meniscus and the second fluid meniscus.

14. An apparatus for processing a substrate as recited in claim 13, wherein the first set of conduits include,
at least one inlet for applying a first fluid to the surface of the wafer, and
at least one outlet for removing at least the first fluid from the surface of the wafer.

15. An apparatus for processing a substrate as recited in claim 13, wherein the second set of conduits include,
at least one inlet for applying a second fluid to the surface of the wafer, and
at least one outlet for removing the second fluid from the surface of the wafer,
wherein the at least one outlet for removing the first fluid from the surface of the wafer also removes at least a portion of the second fluid.

16. An apparatus for processing a substrate as recited in claim 15, wherein the second set of conduits further includes, at least one inlet for applying a third fluid to the surface of the wafer.

17. An apparatus for processing a substrate as recited in claim 13, wherein the first fluid meniscus is capable of executing one of an etching operation, a cleaning operation, a rinsing operation, a plating operation, or a lithography operation.

18. An apparatus for processing a substrate as recited in claim 13, wherein the second fluid meniscus is capable of executing one of an etching operation, a cleaning operation, a rinsing operation, a plating operation, a drying operation, or a lithography operation.

19. An apparatus for processing a substrate as recited in claim 13, wherein the third fluid decreases a surface tension of the second fluid.

20. An apparatus for processing a substrate as recited in claim 13, wherein the barrier is at least partially phobic to at least one of the first fluid meniscus and the second fluid meniscus.

21. An apparatus for processing a substrate as recited in claim 13, wherein a portion of the barrier is phobic to at least one of the first fluid meniscus and the second fluid meniscus and a portion of the barrier is philic to at least one of the first fluid meniscus and the second fluid meniscus.

22. An apparatus for processing a substrate, comprising:

a proximity head capable of generating a first fluid meniscus and capable of generating a second fluid meniscus, the proximity head including, at least one first inlet defined in a processing surface of the proximity head configured to apply a first fluid to the surface of the wafer;

at least one first outlet defined in the processing surface of the proximity head configured to remove the first fluid and at least a portion of a second fluid from the surface of the wafer;

at least one second inlet defined in the processing surface of the proximity head configured to apply the second fluid to the surface of the wafer;

at least one second outlet defined in the processing surface of the proximity head configured to remove at least a portion of the second fluid from the surface of the wafer; and a barrier defined between the at least one first outlet and the at least one second outlet, the barrier being configured to substantially separate the first fluid meniscus and a the second fluid meniscus.

23. An apparatus for processing a substrate as recited in claim 22, wherein the proximity head further includes, at least one third inlet defined in the processing surface of the proximity head configured to apply a third fluid to the surface of the wafer.

24. An apparatus for processing a substrate as recited in claim 22, wherein the first fluid meniscus is capable of executing one of an etching operation, a cleaning operation, a rinsing operation, a plating operation, or a lithography operation.

25. An apparatus for processing a substrate as recited in claim 22, wherein the second fluid meniscus is capable of executing one of an etching operation, a cleaning operation, a rinsing operation, a plating operation, a drying operation, or a lithography operation.

26. An apparatus for processing a substrate as recited in claim 23, wherein the third fluid decreases a surface tension of the second fluid.

27. An apparatus for processing a substrate as recited in claim 23, wherein the barrier is phobic to at least one of the first fluid meniscus and the second fluid meniscus.

28. An apparatus for processing a substrate as recited in claim 23, wherein a portion of the barrier is phobic to at least one of the first fluid meniscus and the second fluid meniscus and a portion of the barrier is philic to at least one of the first fluid meniscus and the second fluid meniscus.

* * * * *